United States Patent
Li et al.

(10) Patent No.: US 11,335,419 B1
(45) Date of Patent: May 17, 2022

(54) ERASE TECHNIQUE FOR CHECKING INTEGRITY OF NON-DATA WORD LINES IN MEMORY DEVICE AND CORRESPONDING FIRMWARE

(71) Applicant: Western Digital Technologies, Inc., San Jose, CA (US)

(72) Inventors: Liang Li, Shanghai (CN); Ming Wang, Shanghai (CN); Qin Zhen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/197,762

(22) Filed: Mar. 10, 2021

(51) Int. Cl.
*G11C 16/34* (2006.01)
*G11C 16/30* (2006.01)
*G11C 16/16* (2006.01)
*G11C 16/26* (2006.01)
*G11C 16/04* (2006.01)

(52) U.S. Cl.
CPC ...... *G11C 16/3445* (2013.01); *G11C 16/0483* (2013.01); *G11C 16/16* (2013.01); *G11C 16/26* (2013.01); *G11C 16/30* (2013.01); *G11C 16/3404* (2013.01)

(58) Field of Classification Search
CPC . G11C 16/3445; G11C 16/0483; G11C 16/16; G11C 16/26; G11C 16/30; G11C 16/3404
See application file for complete search history.

(56) References Cited

U.S. PATENT DOCUMENTS

| | | | |
|---|---|---|---|
| 5,696,717 | A | 12/1997 | Koh |
| 8,867,271 | B2 | 10/2014 | Li et al. |
| 9,984,760 | B1 | 5/2018 | Zhang et al. |
| 10,699,776 | B1 | 6/2020 | Avital et al. |
| 10,832,790 | B1 | 11/2020 | Bhatnagar et al. |
| 2005/0041515 | A1 | 2/2005 | Futatsuyama et al. |

(Continued)

FOREIGN PATENT DOCUMENTS

KR   20070109684 A   11/2007

OTHER PUBLICATIONS

International Search Report & The Written Opinion of the International Searching Authority dated Sep. 1, 2021, International Application No. PCT/US2021/033671.

*Primary Examiner* — Jay W. Radke
(74) *Attorney, Agent, or Firm* — Vierra Magen Marcus LLP

(57) ABSTRACT

An erase operation for data memory cells is integrated with a process for detecting dummy memory cells and/or select gate transistors which have an out-of-range threshold voltage. In one aspect, an erase operation is performed for the data memory cells of a block followed by a supplementary verify operation for the dummy memory cells and/or select gate transistors. In another aspect, the verify operation occurs during the erase operation and, optionally, also in a supplementary verify operation. A separate pass/fail status can be set for the erase verify of the data memory cells and the verify of the dummy memory cells and/or select gate transistors operations, where the block is assigned to a potential bad block pool or bad block pool based on a status return combination. The out-of-range dummy memory cells and/or select gate transistors can be adjusted by programming or erasing.

20 Claims, 23 Drawing Sheets

(56) References Cited

U.S. PATENT DOCUMENTS

2005/0265081 A1   12/2005  Tran et al.
2008/0014438 A1    1/2008  Ruhle et al.
2015/0178000 A1*  6/2015  Yoon .................. G11C 16/0483
                                                                         711/103
2019/0272879 A1    9/2019  Sudo

* cited by examiner

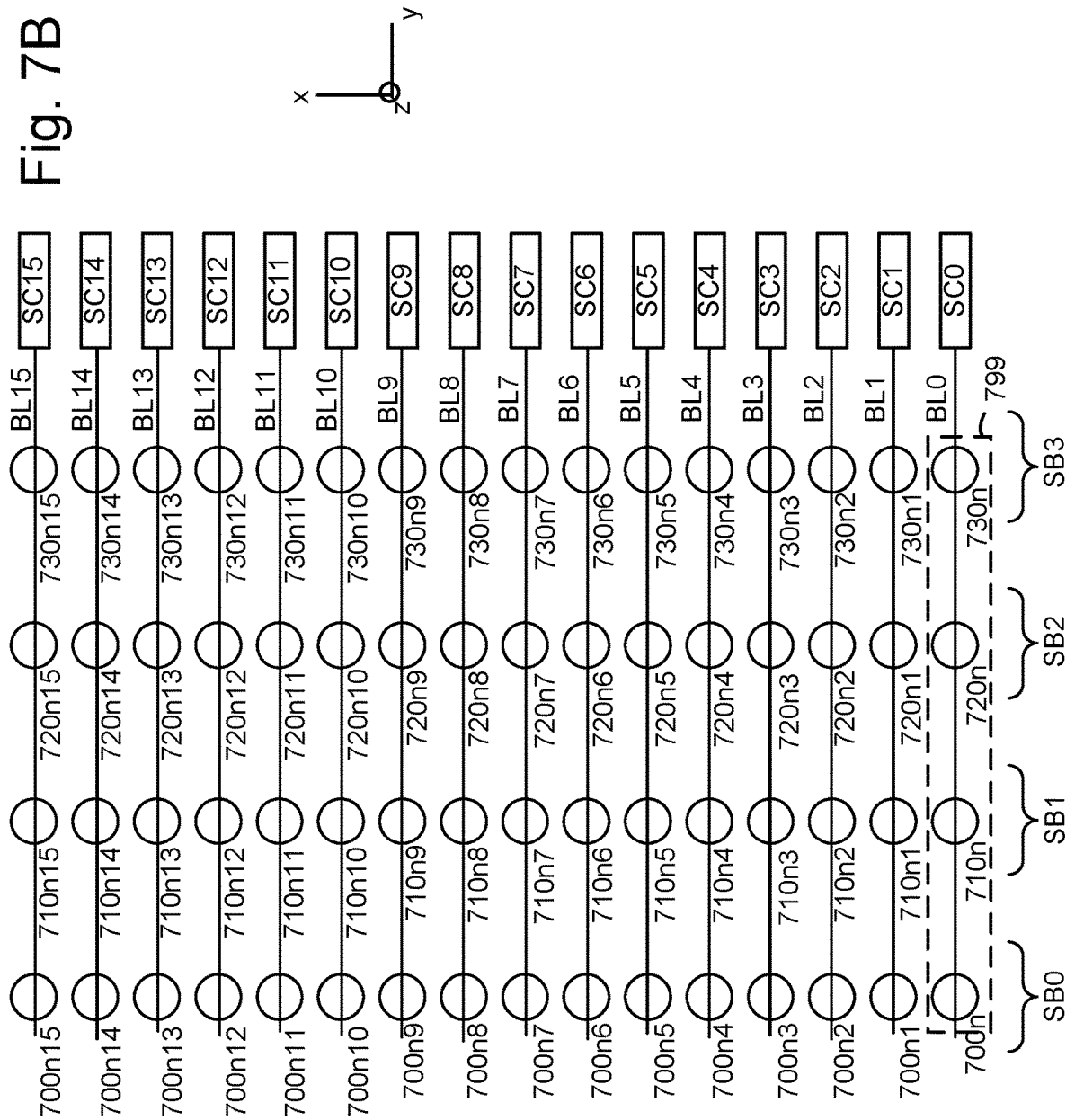

Fig. 22

| Command | IO7 | IO6 | IO5 | IO4 | IO3 | IO2 | IO1 | IO0 |
|---|---|---|---|---|---|---|---|---|
| YYh | 0 | 0 | True busyn 0: true busy 1: true ready | Status of Dummy/ SG verify operation for Plane1 0: pass 1: fail | Status of Dummy/ SG verify operation for Plane0 0: pass 1: fail | Status of erase of data memory cells for Plane1 0: pass 1: fail | Status of erase of data memory cells for Plane0 0: pass 1: fail | Status of erase of data memory cells for chip 0: pass 1: fail |

ERASE TECHNIQUE FOR CHECKING INTEGRITY OF NON-DATA WORD LINES IN MEMORY DEVICE AND CORRESPONDING FIRMWARE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 7B depicts an example top view of the block B0-0 of FIG. 7A, with respective NAND strings, bit lines and sense circuits.

FIG. 22 depicts example commands and statuses for use in the process of FIG. 10.

DETAILED DESCRIPTION

Figure 1A:
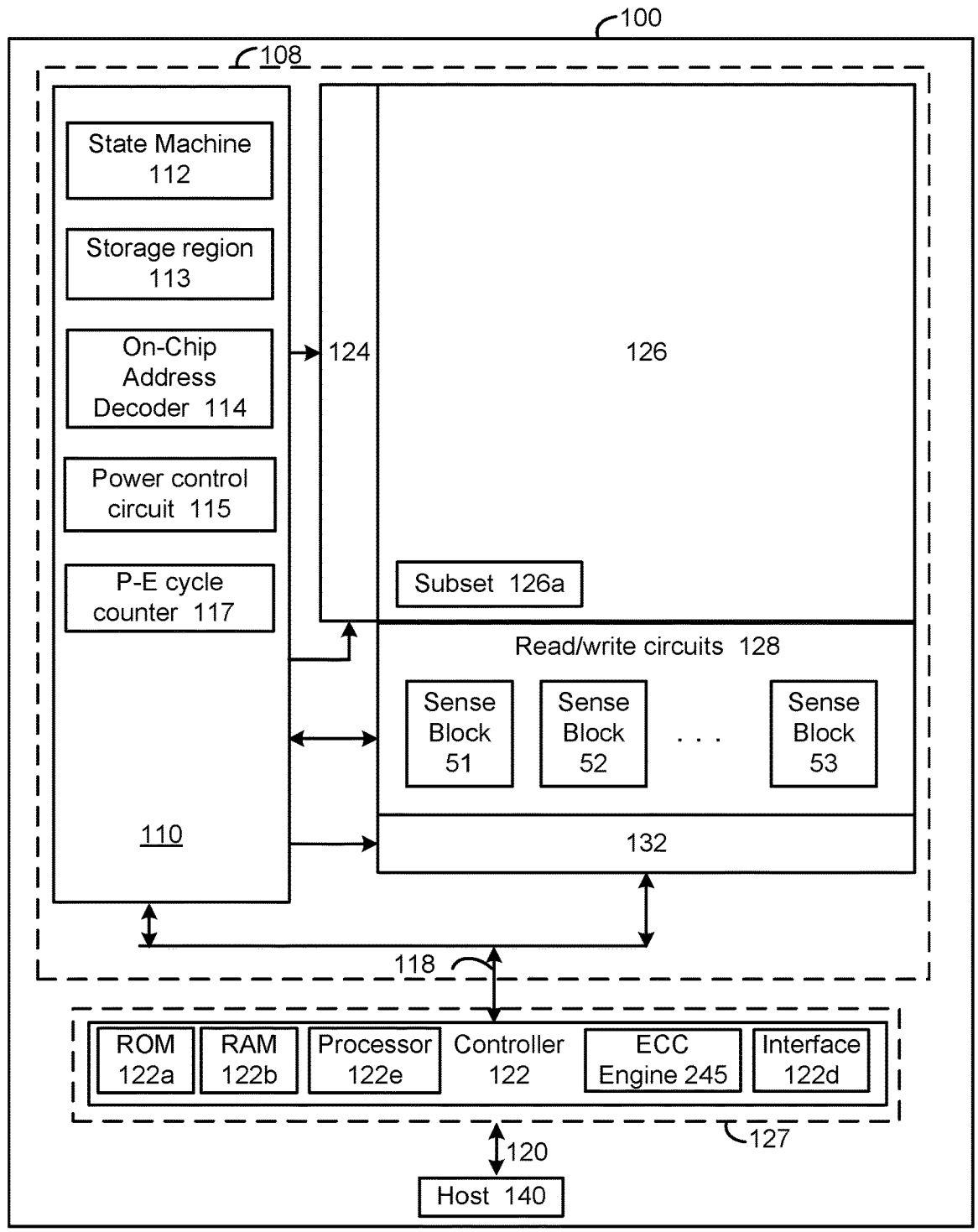
FIG. 1A is a block diagram of an example memory device.

Apparatuses and techniques are described for integrating an erase operation for data memory cells with a process for detecting dummy memory cells and/or select gate transistors which have an out-of-range threshold voltage.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700n in FIG. 6A. A source end 700s of the NAND string is connected to the substrate 611 and a drain end 700d of the NAND string is connected to a bit line, BL0. For example, see FIG. 6A.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

An erase operation for memory cells in a block typically involves one or more erase-verify iterations, also referred to as erase loops, where each iteration involves channel boosting followed by a verify test for data memory cells, until the erase operation is completed. In each erase-verify iteration, the voltages of the channels are boosted while holding the voltages of the word lines at a low level, e.g., at or close to 0 V. The channels are boosted by applying one or more erase pulses to the block. In one approach, the erase pulse is applied to the substrate, causing holes to be injected into the channels via the source ends of the NAND strings. In another approach, the channels are boosted by generating holes at the source end and/or drain end of the NAND strings using gate-induced drain leakage (GIDL). This involves providing a strong back bias of the SGS and/or SGD transistors, respectively.

The boosting of the channels creates a large channel-to-gate voltage which drives holes into the charge trapping layers, lowering the threshold voltage (Vth) of the memory cells. A verify test, which is a sensing operation, can be performed after the application of the erase pulse to determine if the Vth of the memory cells has been lowered below a verify voltage, VvEr. A verify test typically tests the erase level of a set of NAND strings by sensing a current in the set of NAND strings, as discussed, e.g., in connection with FIG. 7B. The erase operation is completed when the verify test is passed by all or nearly all of the sets of NAND strings.

However, the operation of the data memory cells in a NAND can be impaired when the Vth shifts outside of an allowable range for the dummy memory cells and/or select gate transistors, which are connected to non-data word lines or control lines. For example, such a shift has been observed in a 3D NAND string which uses a MONOS structure for the data memory cells, dummy memory cells and select gate transistors. A MONOS structure refers to metal-oxide-nitride-oxide-silicon layers deposited in a memory hole to form a NAND string. Due to this construction, inadvertent Vth shifts can occur when the data memory cells are programmed, read or erased. In some cases, an erase operation for the data memory cells will be completed successfully even if the Vth of the dummy memory cells and/or select gate transistors has shifted out of range. However, a program failure or a read error, e.g., uncorrectable read errors, may subsequently occur, potentially leading to the loss of data. The Vth shift can also occur in 2D NAND strings, particularly in the dummy memory cells, which have the same construction as the data memory cells.

One approach to detecting these Vth shifts is to perform a screening process during the factory testing of the memory device. However, this approach can over-classify blocks as being bad while not addressing Vth shifts which occurs when the memory device is in the hands of the end user.

Techniques provided herein address the above and other issues. In one aspect, an erase operation for data word lines is integrated with a verify operation for dummy memory cells and/or select gate (SG) transistors which detects an out-of-range Vth. In one approach, an erase operation is performed for the data memory cells of a block followed by a supplementary verify operation for the dummy memory cells and/or SG transistors. These verify operations are part of the overall erase process. A separate pass/fail status can be set for the erase and verify operations, where the block is assigned to a potential bad block pool if the verify operation has a fail status and the erase operation has a pass status. Further, the block can be assigned to a bad block pool if erase operation has a fail status regardless of the status of the verify operation. When a threshold number of blocks are in the potential bad block pool, the out-of-range dummy memory cells and/or SG transistors are re-trimmed, e.g., their Vth is brought back in range by programming or erasing operations. The block is then tested with an erase operation for the data memory cells followed by a supplementary verify operation for the dummy memory cells and/or SG transistors. If the statuses are both a pass status, the block is returned to a good block pool. If the statuses are not both a pass status, the block is retired permanently to a bad block pool.

In one aspect, the verify operation for the dummy memory cells and/or SG transistors occurs during the erase operation and, optionally, also in a supplementary verify operation. For example, the verify operation for the dummy memory cells and/or SG transistors can occur concurrently with an erase-verify test for the data memory cells in each erase-verify loop of the erase operation. In another option, the verify operation for the dummy memory cells and/or SG transistors occurs in a first erase-verify loop of the erase operation.

Further, a command sequence can be defined for initiating an erase operation and a verify operation. In one approach, a prefix command precedes a normal erase command to indicate that certain verify operations are to be performed for dummy memory cells and/or SGD transistors during the erase operation and/or in a supplementary verify operation. A further command is a dedicated status return command to read out the statuses of the erase operation and the verify operation. In another approach, the erase and verify operations are initiated by a device parameter on the memory chip.

The techniques advantageously do not result in data loss or the need to move data to a backup block since a potential bad block is detected while the block is in an erased state.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, and a P-E cycle counter. The P-E cycle counter can count P-E cycles to determine when to take a particular action. For example, when the number of cycles reaches one or more specified levels, a verify operation can be performed to determine whether the Vth of dummy memory cells and/or select gate transistors is out-of-range. For example, the predefined levels can be 100, 200, 300 . . . P-E cycles. See FIG. 11, step 1101.

A storage region 113 may also be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, P-E cycle counter 117, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
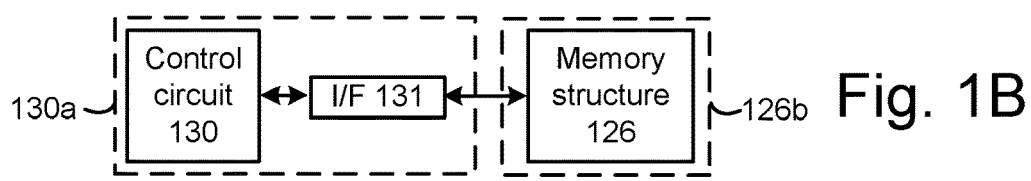
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
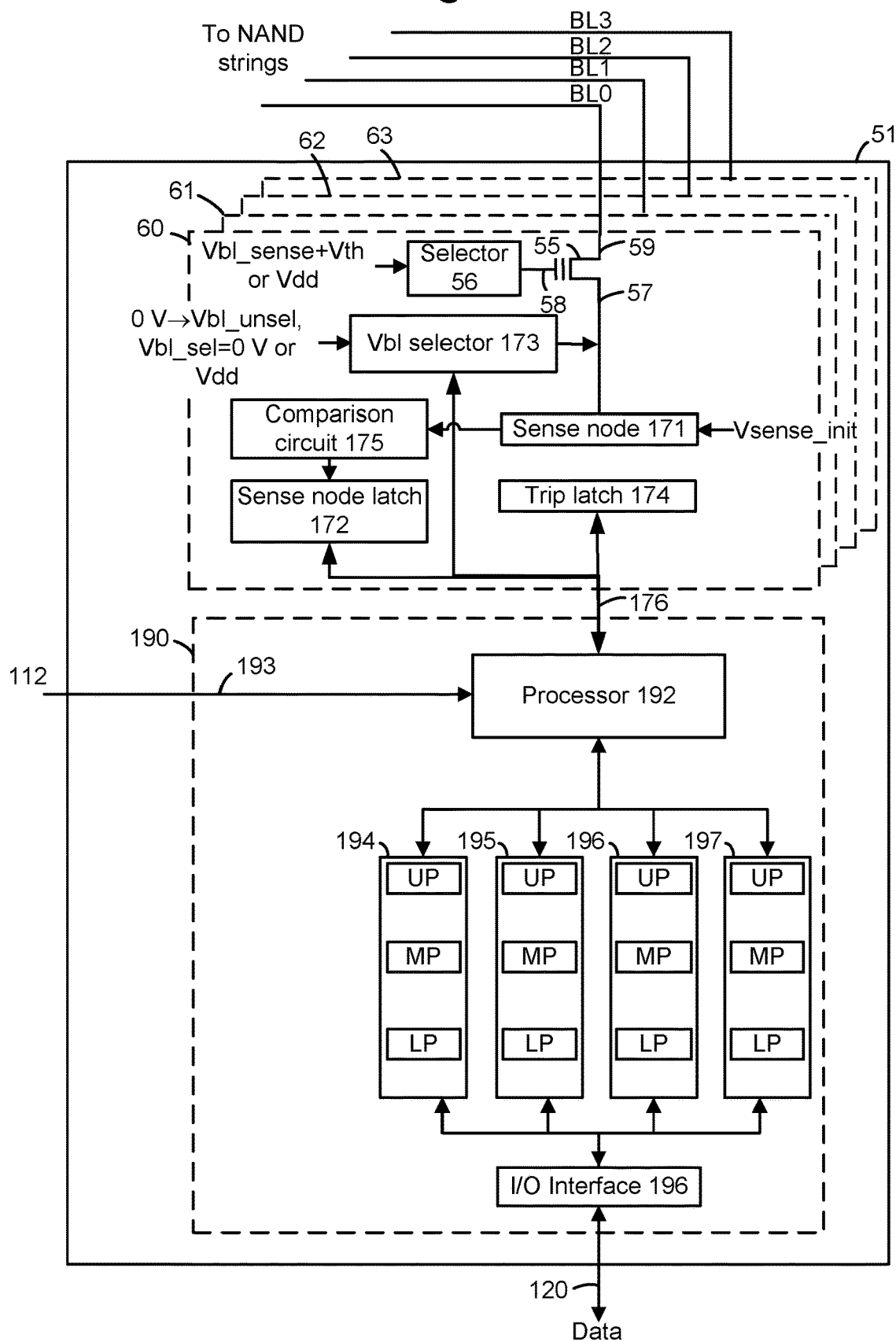
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit 60-63 is connected to a respective bit line BL0-BL3, respectively, which in turn is connected to one or more NAND strings. For example, in a configuration consistent with FIG. 7B, each bit line is connected to four NAND strings—one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_unsel for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and a level of the sense node is used to determine whether a memory cell is in a conductive or non-conductive state. A relatively high or low level indicates the memory cell is in a non-conductive or conductive state, respectively, as represented by a 0 or 1, respectively.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LP, MP and UP, can be provided for each sense circuit. When a set of memory cells is in a three bit per cell mode, LP stores a bit for a lower page of data, MP stores a bit for a middle page of data, and UP stores a bit for an upper page of data. In some cases, a different number of data latches may be used.

At the start of a program operation, the data latches identify the assigned data state of each memory cell. When a memory cell completes programming, its associated data latches can be set to identify the erased state so that it will be inhibited from further programming in any subsequent program loops of the program operation.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

Figure 3:
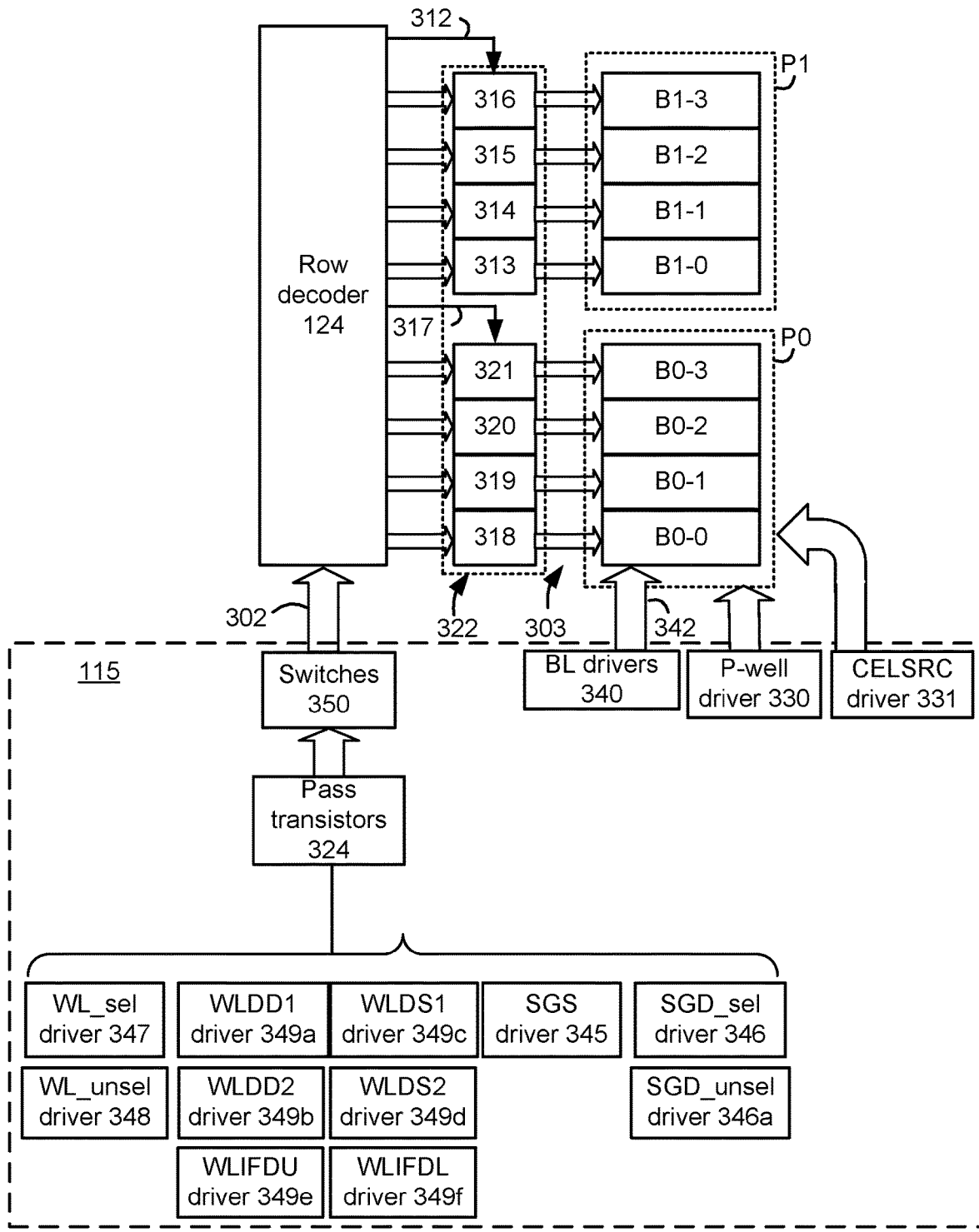
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_unsel driver 348 provides a voltage signal on unselected data word lines. A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612b in the p-well region 612, e.g., via the conductive path 682. See FIG. 5A. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 5A.

Bit line (BL) voltage drivers 340 include voltage sources which provide voltages to the bit lines 342. The bit line voltage for sensing can be 0.5 V, for example.

Figure 4:
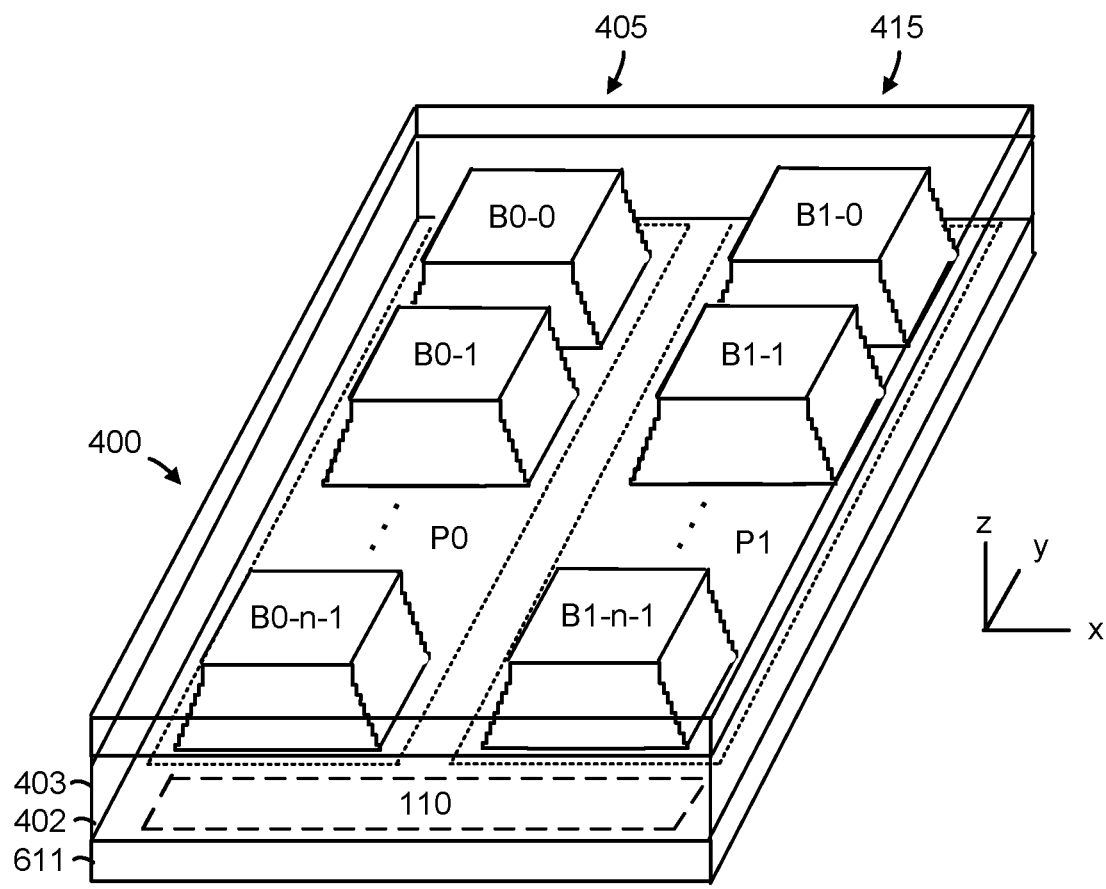
FIG. 4 is a perspective view of an example memory die 400 in which blocks are provided in respective planes P0 and P1, consistent with FIG. 1A.

FIG. 4 is a perspective view of an example memory die 400 in which blocks are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry. The commands in FIG. 22 provide a pass/fail status for erase operations in planes P0 and P1 as an example.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
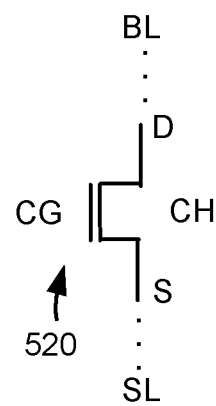
FIG. 5 depicts an example transistor 520 in the memory structure 126 of FIG. 1A.
Figure 6A:
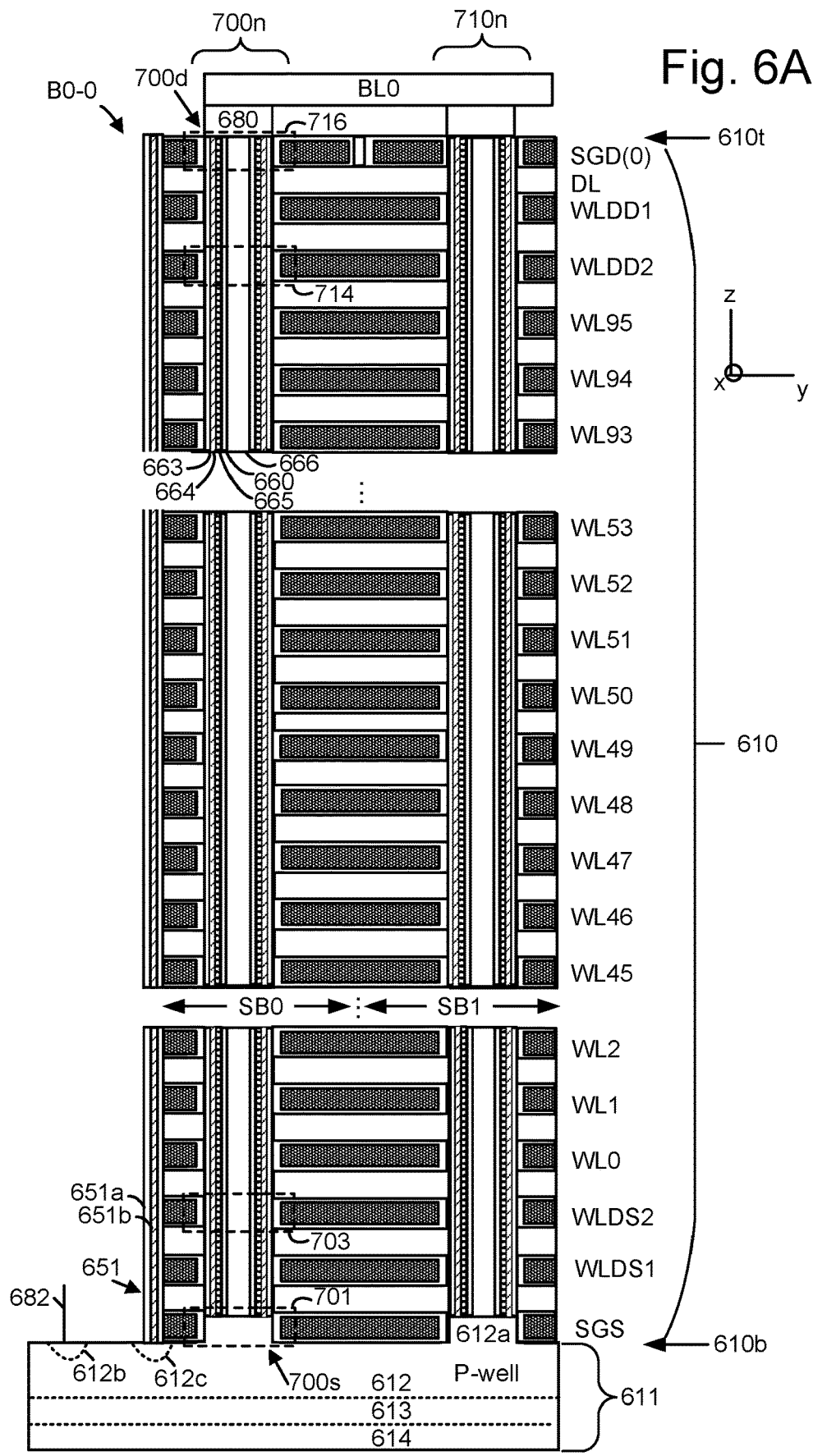
FIG. 6A depicts an example cross-sectional view of a portion of the block B0-0 of FIG. 4, including NAND strings 700n and 710n, in a single-tier stack.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of the block B0-0 of FIG. 4, including NAND strings 700n and 710n, in a single-tier stack. In this example, the NAND strings 700n and 710n are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+contact 612c connected to a local interconnect 651 for receiving a source line voltage, and a p+contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665. As a result, there is a reduced likelihood of a Vth shift. The verify operations as discussed herein can be omitted for the SGS transistors, in one approach. In another possible approach, the verify operations as discussed herein can be included for the SGS transistors.

Figure 6B:
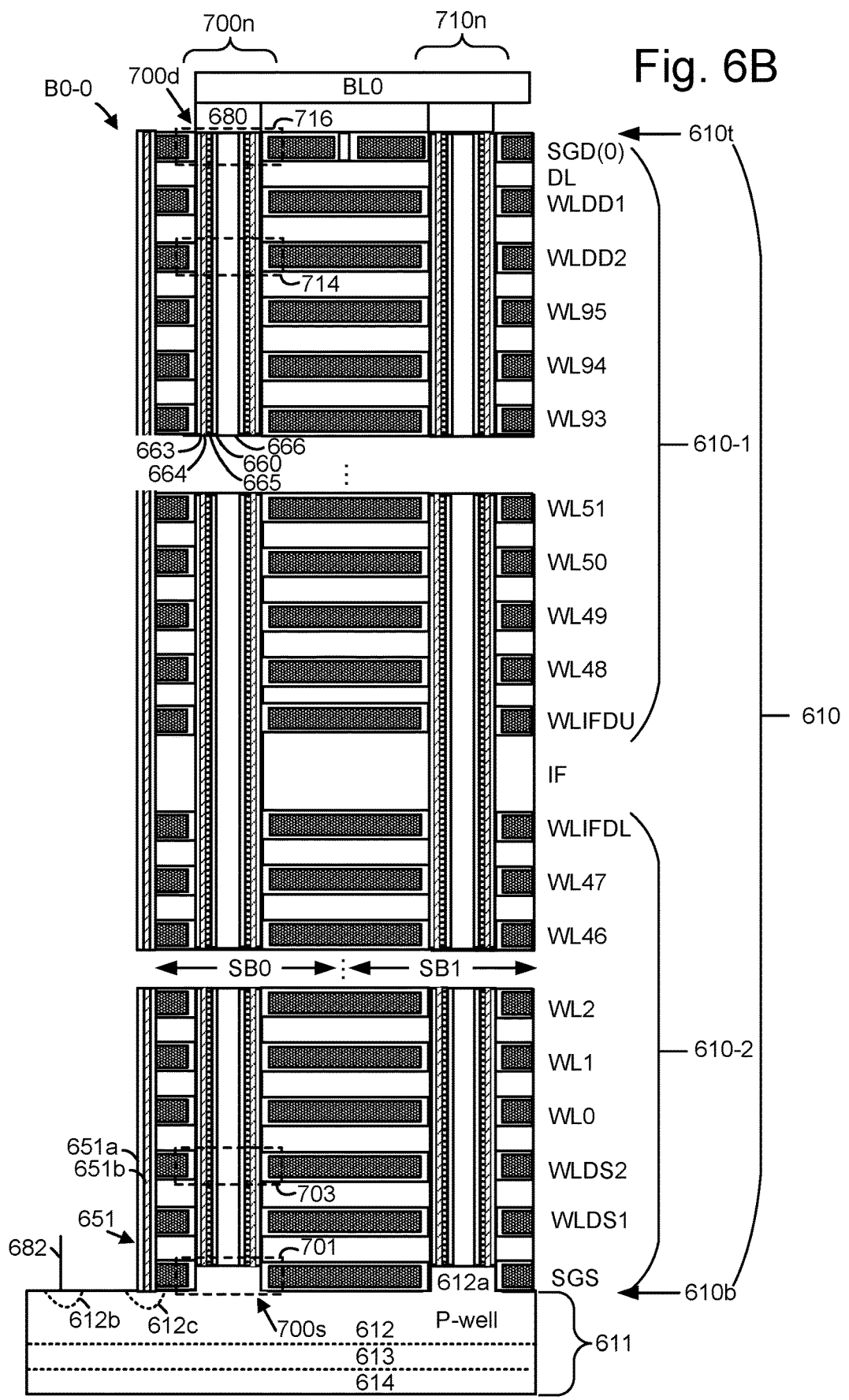
FIG. 6B depicts an example cross-sectional view of a portion of the block B0-0 of FIG. 4, including NAND strings 700n and 710n, in a two-tier stack comprising an upper tier 610-1 and a lower tier 610-2.

FIG. 6B depicts an example cross-sectional view of a portion of the block B0-0 of FIG. 4, including NAND strings 700n and 710n, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

Figure 7A:
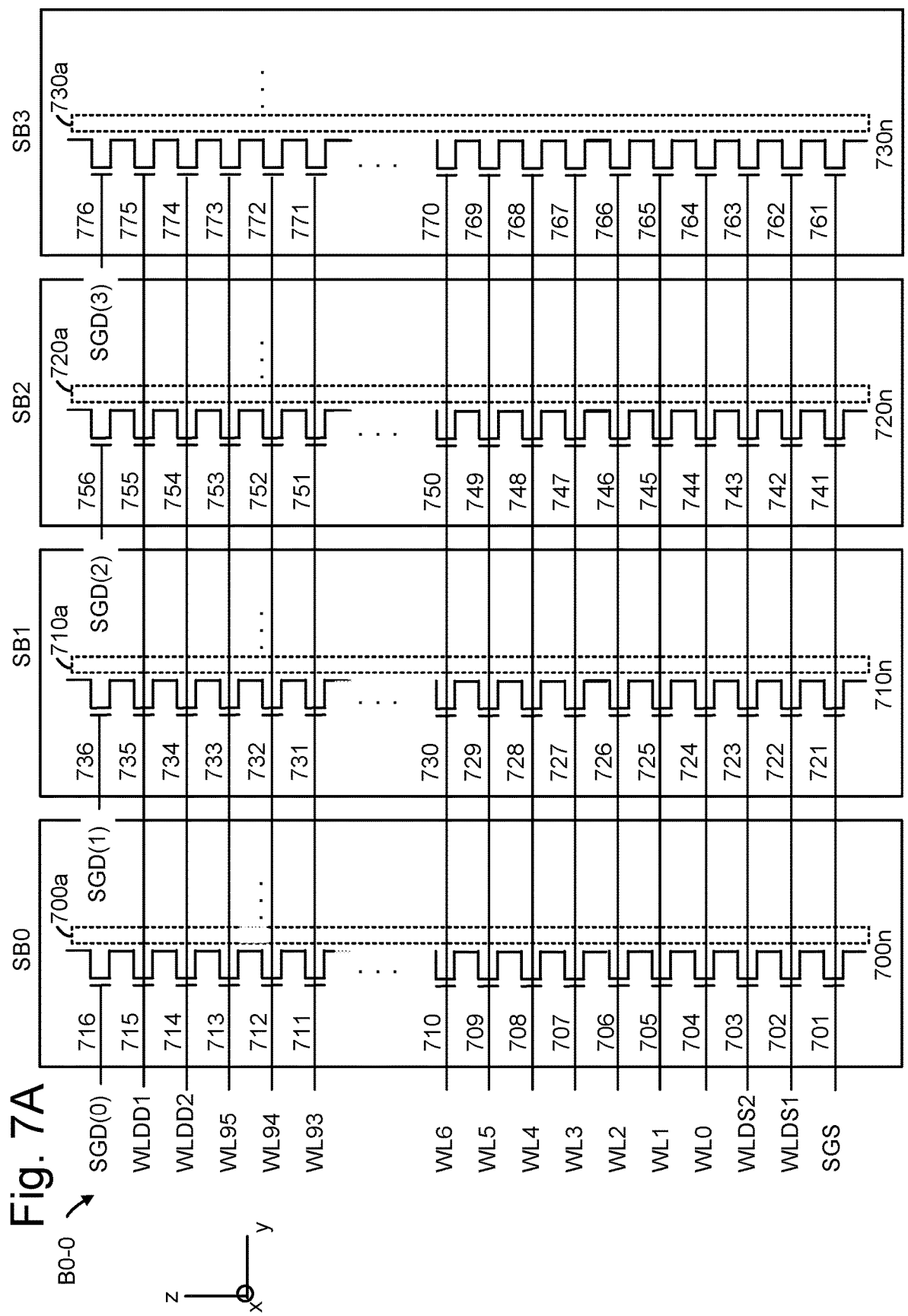
FIG. 7A depicts an example view of NAND strings in the block B0-0 which is consistent with FIGS. 4 and 6A.

FIG. 7A depicts an example view of NAND strings in the block B0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD(2) and SGD(3), respectively, in one approach.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

In a verify test in an erase operation, a verify voltage VvEr is applied to the word lines. See FIG. 8. At the same time, each sense circuit senses a current on a respective bit line based on a sum of the currents in the respective NAND strings connected to the bit line. For example, SC0 can sense a current on BL0 based on currents in the NAND strings 700n, 710n, 720n and 730n. Thus, a verify test can involve sensing a current in a set of NAND strings connected to each bit line. A set of NAND strings passes the verify test if the current is above a specified level, e.g., the threshold voltages of the memory cells in the set of NAND strings are below the verify voltage. A block passes the verify test if all, or nearly all, of the set of NAND strings pass the verify test. In other words, a block passes the verify test if none, or no more than a specified portion of the sets of NAND strings of the block, fail the verify test. In another possible approach, the sensing occurs one sub-block at a time for each bit line.

A NAND string can pass or fail a verify test when a verify voltage is applied to the word lines. A NAND string fails a verify test when the current in the NAND string is relatively low such that a sense node voltage is relatively high. A failure indicates the Vth is higher than the verify voltage for one or more memory cells in the NAND string. In contrast, a NAND string passes a verify test when the current in the NAND string is relatively high such that a sense node voltage is relatively low. A pass indicates the Vth is lower than the verify voltage for all of the memory cells in the set of NAND strings. See also various examples of verify tests in FIG. 9D-9H.

A set of NAND strings, which may comprise all NAND strings in a block or sub-block, for example, can be considered to pass a verify test when all or nearly all of the NAND strings pass the verify test. For example, a pass may occur when no more than 1-5% of the NAND strings fail the verify test. In practice, it is simpler for the circuitry to count the number of NAND strings which fail the verify test rather than to count the much larger number of NAND strings which pass the verify test.

Figure 8:
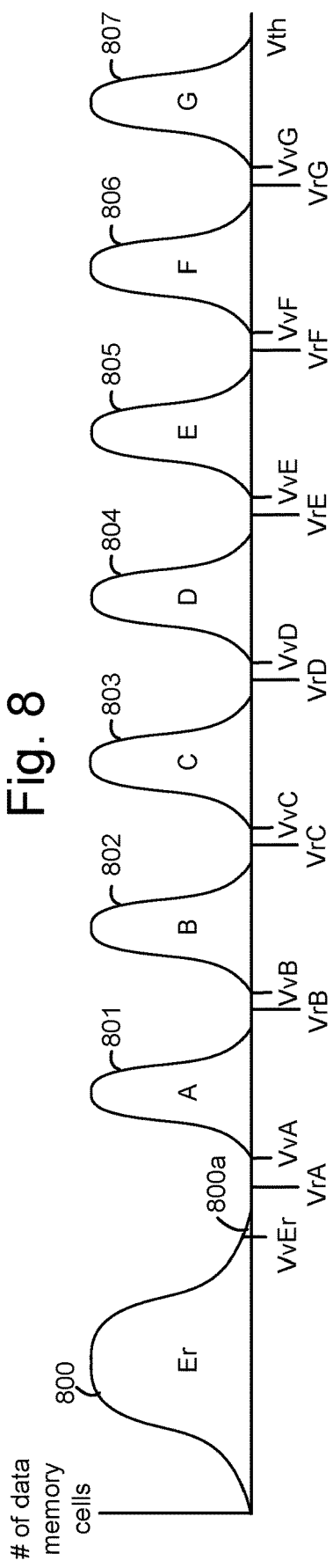
FIG. 8 depicts threshold voltage (Vth) distributions for data memory cells in an eight-state memory device.

FIG. 8 depicts threshold voltage (Vth) distributions for data memory cells in an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 800 is obtained, representing the erased state. The erase operation is completed when the Vth of all, or nearly all, of the data memory cells is below a verify voltage, VvEr.

During a traditional erase-verify test for data memory cells, the state machine checks the number of upper tail memory cells which have Vth>VvEr. This upper tail is represented by the region 800a. If the number of memory cells which are sensed as '0' cells, e.g., non-conductive, is larger than predefined value, then another erase pulse and erase-verify are used.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 801-807, respectively. These memory cells are subject to verify tests using verify voltages of VvA-VvG.

Figure 9A:
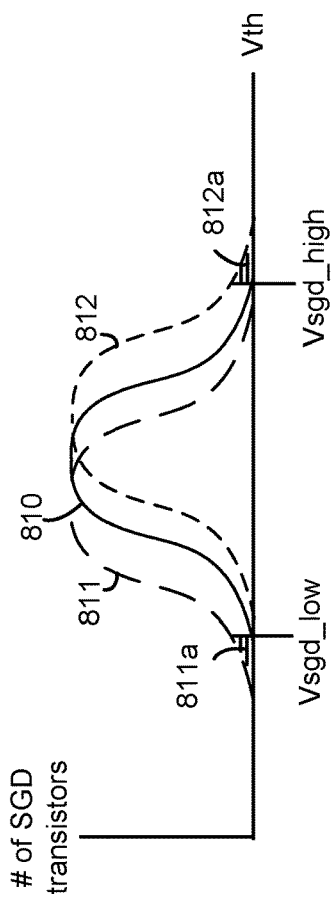
FIG. 9A depicts example Vth distributions for select gate transistors, including a normal Vth distribution 810, a downshifted Vth distribution 811 and an upshifted Vth distribution 812.

FIG. 9A depicts example Vth distributions for select gate transistors, including a normal Vth distribution 810, a downshifted Vth distribution 811 and an upshifted Vth distribution 812. The Vth of a select gate transistor is typically set at the time of manufacture in a process known as trimming. However, the Vth can subsequently shift for various reasons. For example, the Vth can decrease or increase inadvertently due to the removal or addition, respectively, of charges from the charge-trapping layer. A Vth decrease is a data retention loss while a Vth increase is a disturb. The shift in Vth can be caused by voltages applied to the NAND string channel and to other transistors in the NAND string. The shift may worsen as P-E cycles accumulate and may further be caused by environmental factors such as temperature.

A respective allowable range of threshold voltages can be defined which extends between boundary voltages of Vsgd_ low and Vsgd_high. If the Vth of the SGD transistor is too low or high, it can be difficult to turn off or on, respectively. To determine if a set of SGD transistors, such as the SGD transistors in a sub-block, are out-of-range below a minimum allowable level, the SGD transistors can be verified while applying Vsgd_low to their control gates. The conductive SGD transistors, represented by the region 811a, can then be identified as being out-of-range. To determine if the set of SGD transistors are out-of-range above a maximum allowable level, the SGD transistors can be verified while applying Vsgd_high to their control gates. The non-conductive SGD transistors, represented by the region 812a, can then be identified as being out-of-range.

If a verify operation is performed for the SGS transistors, a separate range of allowable threshold voltages can be defined.

For the detection of the upper and lower tails of the SG transistors or dummy memory cells, the state machine can check for '0' cells (upper tail) or '1' cells (lower tail) depended on the type of verify operations which are used. These verify operations are supplementary to the erase-verify operations of the data memory cells.

Figure 9B:
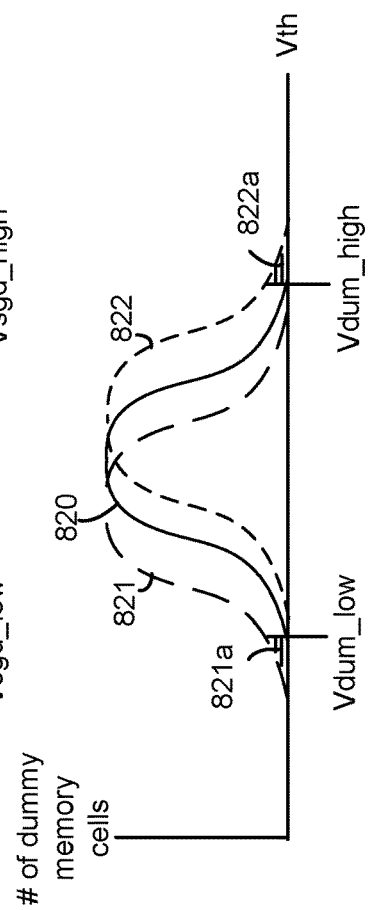
FIG. 9B depicts example Vth distributions for dummy memory cells, including a normal Vth distribution 820, a downshifted Vth distribution 821 and an upshifted Vth distribution 822.

FIG. 9B depicts example Vth distributions for dummy memory cells, including a normal Vth distribution 820, a downshifted Vth distribution 821 and an upshifted Vth distribution 822. As with the SGD transistors, the Vth of a dummy memory cell is typically set at the time of manufacture. However, the Vth can subsequently shift for various reasons.

A respective allowable range of threshold voltages can be defined which ranges between boundary voltages of Vdum_ low to Vdum_high. If the Vth is too low or high, the NAND string current will be lower or higher than expected when sensing the data memory cells. This can interfere with operations such as program-verify, erase-verify and reading of the data memory cells. To determine if a set of dummy memory cells, such as the dummy memory cells in a sub-block, are out-of-range below a minimum allowable level, the dummy memory cells can be verified while applying Vdum_low to their control gates. The conductive dummy memory cells, represented by the region 821a, can then be identified as being out-of-range. To determine if the set of dummy memory cells are out-of-range above a maximum allowable level, the SGD transistors can be verified while applying Vdum_high to their control gates. The non-conductive dummy memory cells, represented by the region 822a, can then be identified as being out-of-range.

This example depicts a single range of allowable Vth levels for dummy memory cells. In another approach, a separate range can be provided for memory cells connected to each dummy word line, e.g., WLDS1, WLDS2, WLDD1 and WLDD2. Or, one range can be defined for the source-side dummy memory cells, e.g., connected to WLDS1 and WLDS2, and another range can be defined for the drain-side dummy memory cells, e.g., connected to WLDD1 and WLDD2. When applicable, another range can be defined for the IF-adjacent dummy memory cells, e.g., connected to WLIFDL and WLIFDU.

Various techniques can be used to detect out-of-range dummy memory cells and/or select gate (SG) transistors. In one approach, verify operations are performed for the dummy memory cells and/or select gate (SG) transistors during the erasing of the data memory cells. For example, these verify operations can occur between erase pulses which are applied to the NAND strings. In one approach, these verify operations are concurrent with verify operations for data memory cells. In this approach, these verify operations occur in place of verify operations for data memory cells. In another approach, these verify operations occur after erasing of the data memory cells is complete. Combinations of these approaches can be used as well.

Figure 10:
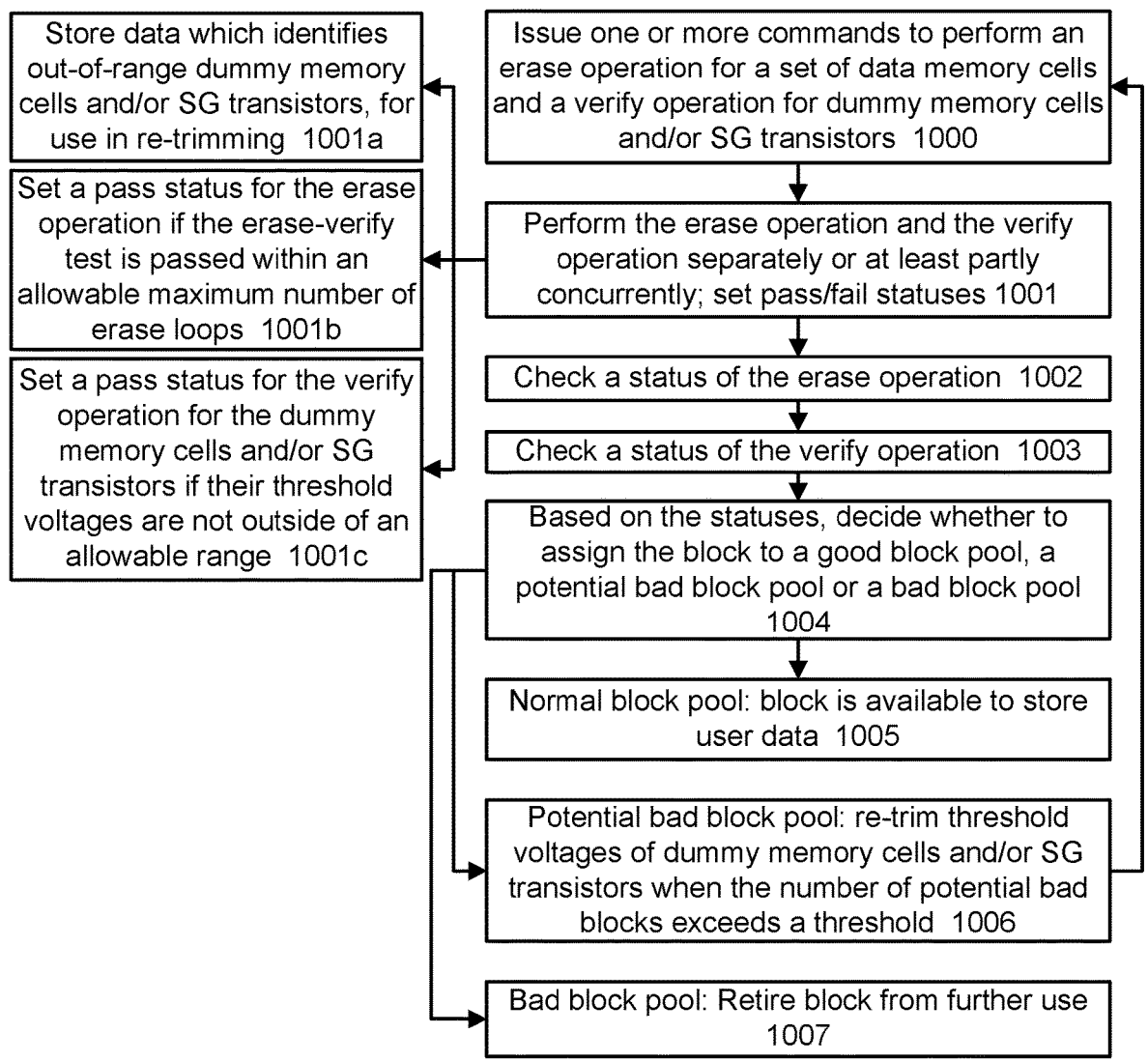
FIG. 10 depicts a flowchart of a process at a controller which integrates an erase operation with a process for identifying and re-trimming out-of-range dummy memory cells and/or select gate transistors.

FIG. 10 depicts a flowchart of a process at a controller which integrates an erase operation with a process for identifying and re-trimming out-of-range dummy memory cells and/or select gate transistors. The process proactively identifies Vth shifts in dummy memory cells and/or SG transistors when the block is in an erased state so that faulty blocks can be identified and re-trimmed without interfering with the end user's experience.

Step 1000 includes issuing one or more commands to perform an erase operation for a set of data memory cells and a verify operation for dummy memory cells and/or SG transistors. The verify operation for the dummy memory cells and/or SG transistors can use at least one boundary voltage of an allowable range of threshold voltages, to determine whether the dummy memory cells and/or SG transistors have an out-of-range Vth.

Step 1001 includes performing the erase operation and the supplemental verify operation separately or at least partly concurrently, and setting pass/fail statuses. In one approach, a first pass/fail status is set for the erase verify for data memory cells and a second pass/fail status is set for the erase verify operation for dummy memory cells and/or SG transistors.

In connection with step 1001, step 1001a includes storing data which identifies out-of-range dummy memory cells and/or SG transistors, for use in re-trimming. For example, the controller 122 can use the RAM 122b to store the data. In another approach, a block of memory cells is used to store the data. Each NAND string in a sub-block can be numbered sequentially so that an out-of-range SGD transistor, for example, can be identified in a table or other data structure by the combination of a NAND string identifier and a sub-block identifier. A further data field can indicate whether the Vth of the SGD transistor is above the maximum allowable Vth or below the minimum allowable Vth. See FIG. 24. Step 1001b includes setting a pass status for the erase operation if the erase-verify test is passed within an allowable maximum number of erase loops. Otherwise, a fail status is set for the erase verify operation for data memory cells. Step 1001c includes setting a pass status for the verify operation for the dummy memory cells and/or SG transistors if their threshold voltages are not outside of an allowable range. Otherwise, a fail status is set for the erase verify operation for dummy memory cells and or SG transistors.

Step 1002 includes checking a status of the erase operation and step 1003 includes checking a status of the verify operation. Step 1004 includes, based on the statuses of steps 1002 and 1003, deciding whether to assign the block to a good block pool, a potential bad block pool or a bad block pool. Step 1005 indicates that, in a good block pool, the block is available to store user data. A good block pool does not have out-of-range SG transistors and/or dummy memory cells.

Step 1006 indicates that in a potential bad block pool, the threshold voltages of dummy memory cells and/or SG transistors can be-retrimmed, e.g., adjusted by programming and/or erasing, when the number of potential bad blocks exceeds a threshold or at other times. A block budget can be provided which allows for a threshold number of potential bad blocks to be maintained without initiating re-trimming. Once the number of potential bad blocks exceeds the budget, re-trimming can be initiated so that the number of unusable blocks does not grow too high. The re-trimming can be checked by performing steps 1000-1004 again. If the re-trimming operation is successful, the block is returned to the good block pool, at step 1005. If the re-trimming operation fails, the block is assigned to the bad block pool, at step 1007. See also FIG. 23. Step 1007 indicates that in a bad block pool, the blocks are permanently retired from further use. The blocks which are maintained in the potential bad block pool or the bad block pool are faulty and are not currently available to store user data.

In one approach, a control circuit is configured to assign the block to a good block pool if the status of the erase operation and the verify operation are both a pass status, a potential bad block pool if the status of the erase verify for data memory cells is the pass status and the status of erase verify operation for dummy memory cells and or SG transistor is the fail status, and a bad block pool is the status of the erase operation is the fail status and the status of the verify operation is the pass or fail status.

This approach assumes that a fail status for the erase operation is not caused by the dummy memory cells and/or SG transistors being out of range. However, as an option, the block can be assigned to the potential bad block pool even if the status of the erase operation and the verify operation are both the fail status, based on the theory that the fail status for the erase operation could be caused by the dummy memory cells and/or SG transistors being out of range, such that a re-trimming operation can render the block useful again.

Figure 11:
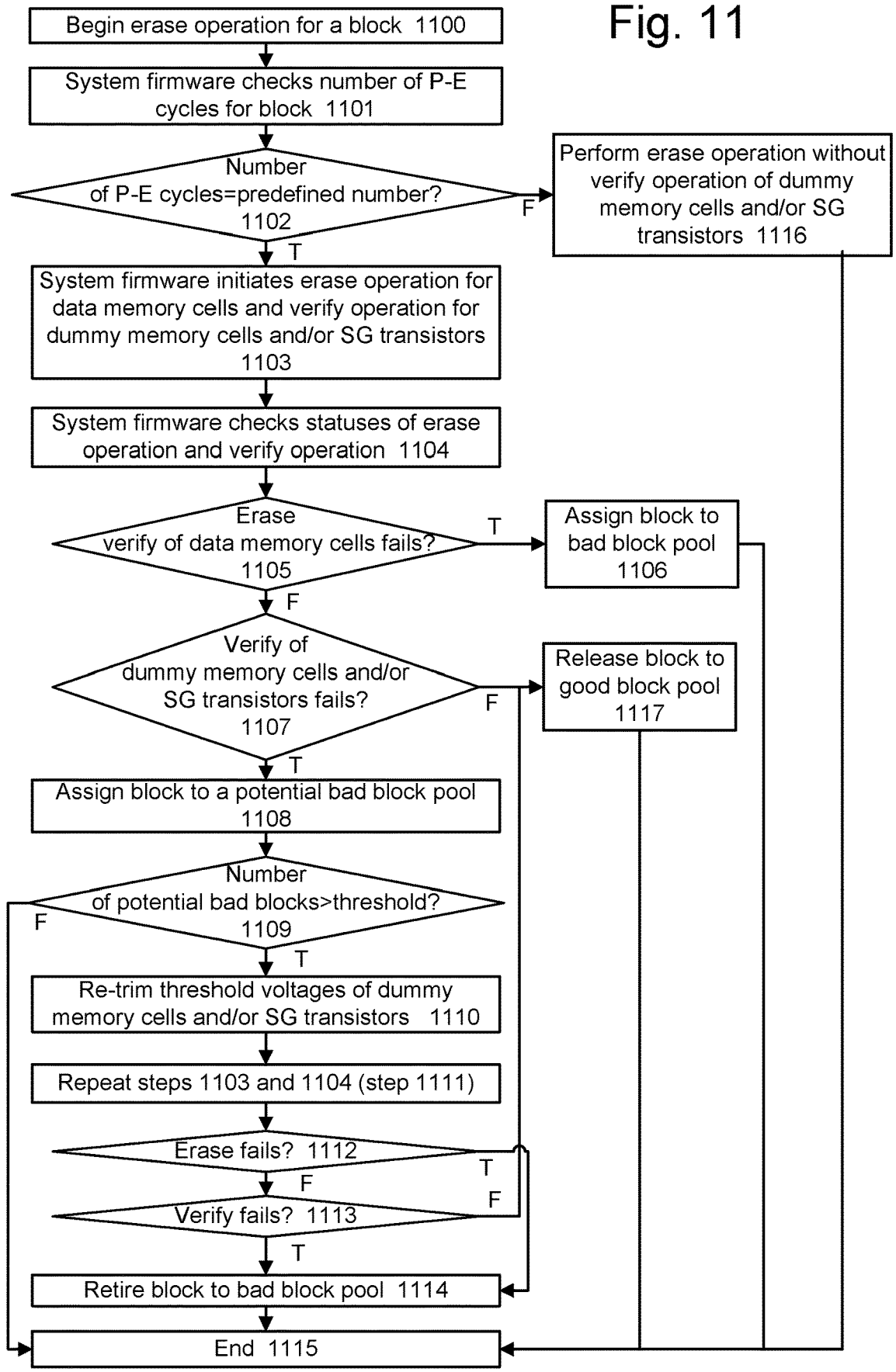
FIG. 11 depicts a flowchart of an example general implementation of the process of FIG. 10.

FIG. 11 depicts a flowchart of an example general implementation of the process of FIG. 10. The process can be implemented in firmware, in one approach. In the field, a status return of the NAND chip indicates both the result of the erase operation and the result of the verify operation which checks the integrity of the dummy memory cells and/or SG transistors. The status return can be used as handshake signal by the system, and the firmware can perform further actions based on the status return. If the memory device is not time-sensitive to the erase time, the process could potentially be used in each write/erase cycle. If the memory device is time-sensitive to the erase time, the process can be invoked at predefined P-E cycles for each block. A block which has a fail status for the erase operation for data memory cells will be put into a bad block pool directly. A block which does not have a pass status for the verify operation for dummy memory cells and or SG transistors but has a pass status for the erase operation of data memory cells can be assigned to a potential bad block pool. If the number of potential bad blocks is higher than a predefined threshold, the system and firmware will re-trim the dummy memory cells and/or SG transistors during a system standby period, when no other task of higher priority is pending. Subsequently, the block can be checked by the same erase operation and verify operation which identified the out-of-range Vth. Based on a result of this check, the system can decide to assign the block to a bad block pool or to release it to a good block pool.

Step 1100 begins an erase operation for a block. Step 1101 indicates that system firmware checks the number of P-E cycles. For example, firmware in the state machine 112, controller 122 or control circuit 130 of FIG. 1A can check the number of P-E cycles in the P-E cycle counter. See the P-E cycle counter 117 of FIG. 1A. A decision step 1102 determines whether the number of P-E cycles is equal to a predefined number. If the decision step 1102 is false, step 1116 performs the erase operation for the data memory cells without a verify operation of the dummy memory cells and/or SG transistors. If the decision step 1102 is true, at step 1103, the system firmware initiates an erase operation for the data memory cells and a verify operation for dummy memory cells and/or SG transistors. At step 1004, the system firmware checks the statuses of the erase operation and verify operation for the dummy memory cells and/or SG transistors.

As mentioned, if the system is in a time-sensitive mode, the erase operation can be performed without the verify operation. The erase operation with the verify operation can be deferred until a time when the system is not in a time-sensitive mode.

A decision step 1105 determines if the erase verify operation for the data memory cells has a fail status. If the decision step 1105 is true, step 1106 assigns the block to a bad block pool and the process ends at step 1115. If the decision step 1105 is false, a decision step 1107 determines whether the verify operation for the dummy memory cells and/or SG transistors has a fail status. If the decision step 1107 is false, step 1117 releases the block to a good block pool. If the decision step 1107 is true, step 1108 assigns the block to a potential bad block pool. For example, a control circuit can store identifiers of blocks to indicate the pool to which they are assigned.

Figure 23:
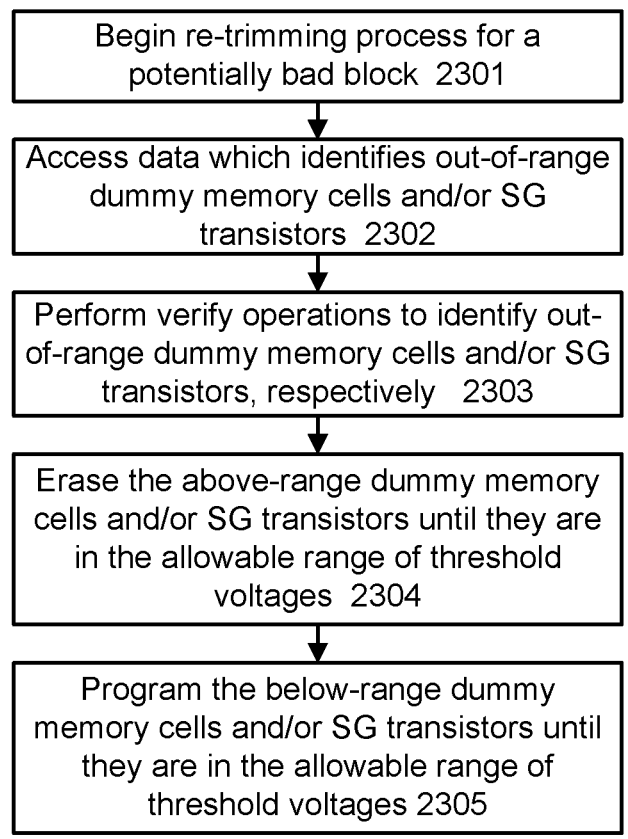
FIG. 23 depicts an example process for re-trimming the threshold voltages of dummy memory cells and/or select gate transistors, consistent with the process of FIG. 10, step 1006.

A decision step 1109 determines if the number of potential bad blocks exceeds a threshold. If the decision step 1109 is false, step 1115 ends the process, so that no re-trimming occurs. If the decision step 1109 is true, step 1110 includes re-trimming the threshold voltages of the dummy memory cells and/or SG transistors such as depicted in FIG. 23. Step 1111 involves repeating step 1103 and 1104. In this case, the erase operation for the data memory cells and the verify operation for the dummy memory cells and/or SG transistors is repeated, and the statuses of the erase operation and verify operation are re-checked.

Specifically, a decision step 1112 determines if a fail status is set for the erase operation. If the decision step 1112 is true, step 1114 retires the block to the bad block pool. That is, the block is identified as being in a bad block pool. For example, a control circuit can store identifiers of blocks in the bad block pool. If the decision step 1112 is false, a decision step 1113 determines if the verify operations for the dummy memory cells and/or SG transistors have a fail status. If the decision step 1113 is false, step 1117 releases the block to the good block pool. If the decision step 1113 is true, step 1114 retires the block to the bad block pool and the process ends at step 1115.

Figure 12:
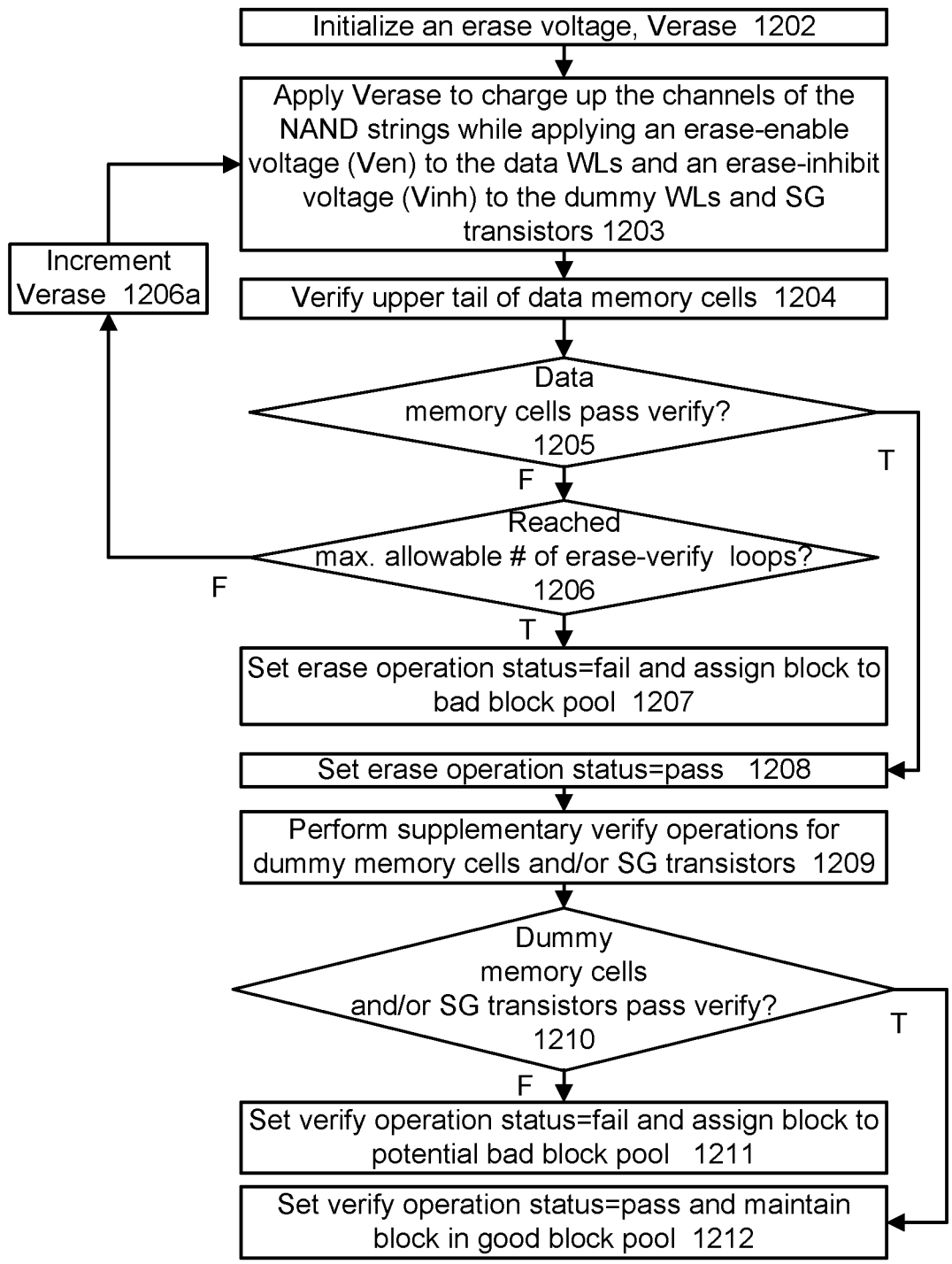
FIG. 12 depicts a flowchart of an example implementation of a process at a memory device consistent with FIGS. 9A, 10 and 11, where a supplementary verify operation is used to detect out-of-range dummy memory cells and/or select gate transistors.

FIG. 12 depicts a flowchart of an example implementation of a process at a memory device consistent with FIGS. 9A, 10 and 11, where a supplementary verify operation is used to detect out-of-range dummy memory cells and/or select gate transistors. Step 1202 initializes an erase voltage Verase. Step 1203 applies Verase to charge up the channels of the NAND strings while applying an erase-enable voltage, Ven (e.g., a relatively low voltage such as 0-0.5 V) to the data word lines (WLs) and an erase-inhibit voltage, Vinh (e.g., a relatively high voltage such as 10 V) to the dummy word lines and SG transistors. With a relatively low voltage on its control gate, and a charged up channel, a data memory cell will have a relatively high channel-to-gate voltage which induces erasing. With a relatively high voltage on its control gate, and a charged up channel, a dummy memory cell or SG transistor will have a relatively low channel-to-gate voltage which inhibits erasing.

As mentioned, one option for the charging up of the channels is to apply the erase pulse to the substrate, to inject holes into the channel from the p-well of the substrate. Another option for charging up the channel involves biasing the SGD and/or SGS transistors to generate holes by gate-induced drain leakage.

Step 1204 involves verifying the upper tail of the data memory cells. This can involve evaluating the level of a sense node while concurrently applying an erase-verify voltage to the data word lines and a read pass voltage, Vread, to the dummy word lines and SG transistors. A Vread of 8-10 V, for example, provides the dummy memory cells and SG transistors in a strongly conductive state so that the sensing reflects the Vth of the data memory cells. The sense node voltage in the sense circuit will be relatively low, below a threshold, if the data memory cells are erased and therefore have Vth<VvEr. A decision step 1205 determines if the data memory cells pass the verify test. The verify test can encompass NAND strings in one or more sub-blocks, as discussed in connection with FIG. 7B. If the decision step 1205 is false, and the maximum allowable number (#) of erase-verify loops has not yet been reached such that decision step 1206 is false, Verase is incremented at step 1206a and the process continues at step 1203. If the decision step 1206 is true, step 1207 sets the status of the erase operation to fail, and assigns the block to a bad block pool. If the decision step 1205 is true, step 1208 sets the status of the erase operation to pass.

After the erase operation has a pass status, step 1209 performs supplementary verify operations for the dummy memory cells and/or SG transistors. A decision step 1210 then determines whether the dummy memory cells and/or SG transistors pass their verify test. This can involve comparing the number of out-of-range dummy memory cells to a respective threshold and comparing the number of out-of-range SG transistors to a respective threshold. Or, the number of out-of-range dummy memory cells summed with the number of out-of-range SG transistors can be compared to a respective threshold. The verify test is failed if a number of out-of-range dummy memory cells and/or SG transistors is greater than a threshold. This option allows a small number of dummy memory cells and/or SG transistors to be out-of-range without setting a fail status and assigning the block to a potential bad block pool.

If the decision step 1210 is false, step 1211 sets a fail status for the verify operation and assigns the block to a potential bad block pool. If the decision step 1210 is true, step 1212 sets a pass status for the verify operation and maintains the block in a good block pool.

Figure 13:
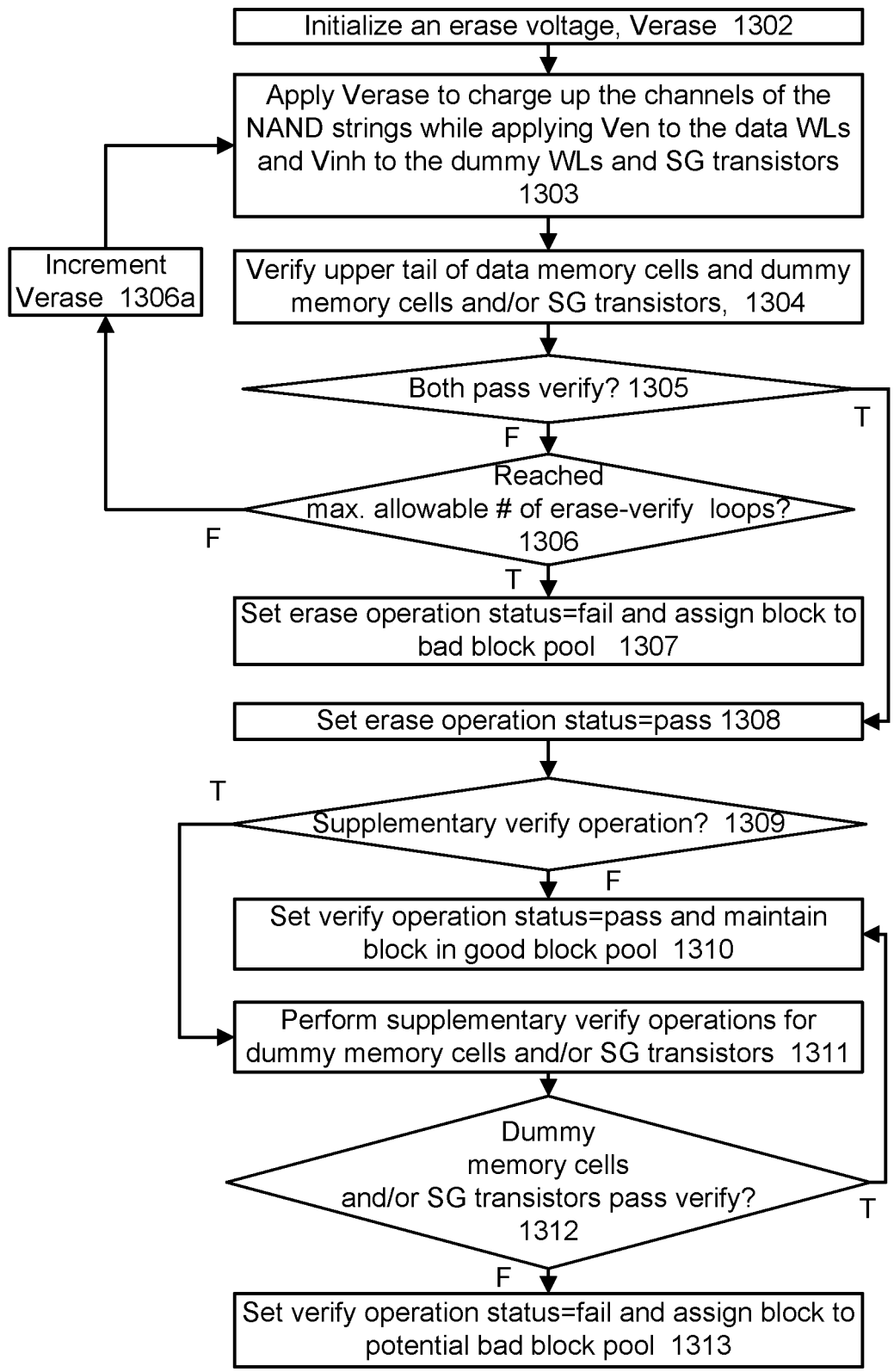
FIG. 13 depicts a flowchart of an example implementation of a process at a memory device consistent with FIGS. 9B, 9C, 10 and 11, where the detection of out-of-range dummy memory cells and/or select gate transistors occurs in each erase loop of an erase operation, and, optionally, also in a supplementary verify operation.

FIG. 13 depicts a flowchart of an example implementation of a process at a memory device consistent with FIGS. 9B, 9C, 10 and 11, where the detection of out-of-range dummy memory cells and/or select gate transistors occurs in each erase loop of an erase operation, and, optionally, also in a supplementary verify operation. Step 1302 initializes an erase voltage Verase. Step 1303 applies Verase to charge up the channels of the NAND strings while applying an erase-enable voltage to the data word lines and an erase-inhibit voltage to the dummy word lines and SG transistors. This is in an erase portion of the erase-verify loop.

Step 1304 involves verifying the upper tail Vth of the data memory cells and the dummy word lines and/or SG transistors. The data memory cells are verified relative to VvEr and the dummy word lines and/or SG transistors are verified relative to an upper boundary verify voltage, e.g., Vdum_high or Vsgd_high, respectively. This is in a verify portion of an erase-verify loop. This can involve evaluating the level of a sense node while concurrently applying an erase-verify voltage to the data WLs and an upper boundary read voltage to the dummy and/or SG transistors.

In one option, the verify operation is for the dummy memory cells and Vread is applied to the SG transistors. In another option, the verify operation is for the SG transistors and Vread is applied to the dummy memory cells.

For example, assume the verify operation is for the SGD transistors and this is concurrent with the erase-verify test of the data memory cells. If the sense node is relatively low, this indicates the NAND string current is relatively high, the data memory cells have been erased and the Vth of the SGD transistors is below the upper boundary. If the sense node is relatively high, and the NAND string current is relatively low, by the time the maximum allowable number of erase-verify loops have been performed, this indicates that either the data memory cells have not been successfully erased or the data memory cells have been successfully erased but the Vth of the SGD transistors is above the upper boundary. In either case, the block is assigned as a potential bad block.

A decision step 1305 determines whether the data memory cells pass their verify test and the dummy memory cells and/or SG transistors pass their verify test. If the decision step 1305 is false, and the maximum allowable number (#) of erase-verify loops has not yet been reached such that decision step 1306 is false, Verase is incremented at step 1306a and the process continues at step 1303. If decision step 1306 is true, step 1307 sets the status of the erase operation to fail and assigns the block to a bad block pool. If the decision step 1305 is true, step 1308 sets the status of the erase operation to pass. After step 1308, a decision step 1309 determines whether a supplemental verify operation is performed. If the decision step 1309 is false, step 1310 sets a status of the verify operation to pass and maintains the block in the good block pool. If the decision step 1309 is true, step 1311 performs supplementary verify operations for the dummy memory cells and/or SG transistors. For example, if an upper boundary verify operation was performed for the SGD transistors during the erase operation, a lower boundary verify operation can be performed for the SGD transistors during the supplementary verify operations. Upper and lower boundary verify operations can also be performed for the dummy memory cells during the supplementary verify operations in this case.

A decision step 1312 determines whether the dummy memory cells and/or SG transistors pass their verify test. If the decision step 1312 is false, step 1313 sets a fail status for the verify operation and assigns the block to a potential bad block pool. If the decision step 1312 is true, step 1310 sets a pass status for the verify operation and maintains the block in a good block pool.

Figure 14:
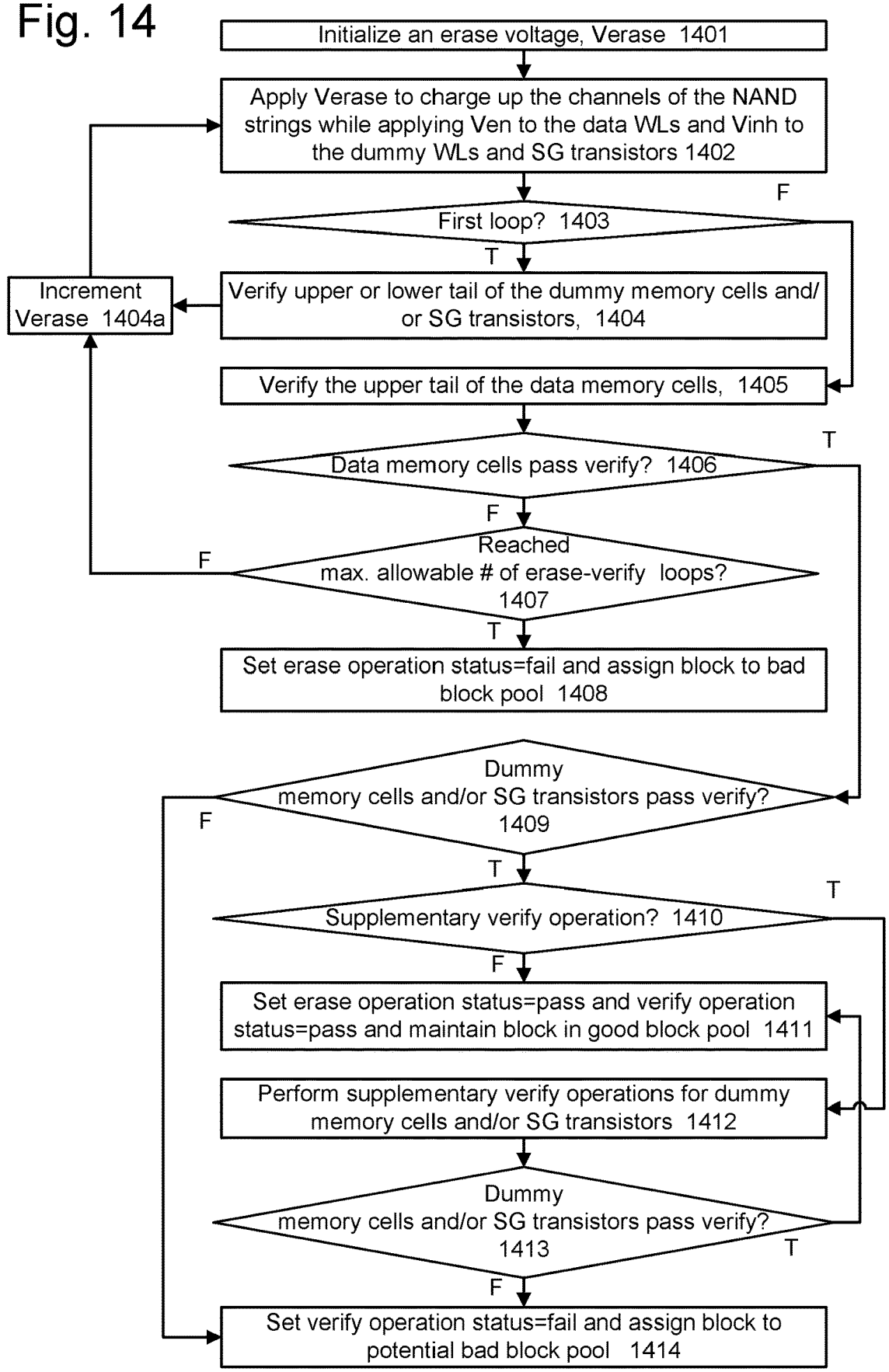
FIG. 14 depicts a flowchart of an example implementation of a process at a memory device consistent with FIGS. 9B, 9C, 10 and 11, where the detection of out-of-range dummy memory cells and/or select gate transistors occurs in a first erase-verify loop of an erase operation, and, optionally, also in a supplementary verify operation.

FIG. 14 depicts a flowchart of an example implementation of a process at a memory device consistent with FIGS. 9B, 9C, 10 and 11, where the detection of out-of-range dummy memory cells and/or select gate transistors occurs in a first erase-verify loop of an erase operation, and, optionally, also in a supplementary verify operation.

Step 1400 begins an erase operation for a set of data memory cells in NAND strings. Step 1401 initializes an erase voltage Verase. Step 1402 applies Verase to charge up the channels of the NAND strings while applying an erase-enable voltage to the data word lines and an erase-inhibit voltage to the dummy word lines and SG transistors. This is in an erase portion of the erase-verify loop.

A decision step 1403 determines whether the current erase loop is the first erase loop of the erase operation. If the decision step 1403 is true, step 1404 includes verifying an upper or lower tail of the dummy memory cells and/or SG transistors. This is in a verify portion of the erase-verify loop. This can involve evaluating the level of a sense node while concurrently applying a read pass voltage, Vread, to the data word lines and a verify voltage, e.g., Vdum_high/low or Vsgd_high/low, to the dummy memory cells and/or SG transistors, respectively. Step 1404a then increments Verase and step 1402 is reached for the next erase loop.

If the decision step 1403 is false, e.g., the current loop is at least one following erase-verify loop, after the first erase-verify loop, and step 1405 involves verifying the upper tail of the data memory cells. This can involve evaluating the level of a sense node while concurrently applying an erase-verify voltage to the data word lines and a read pass voltage, Vread, to the dummy word lines and SG transistors. This is in a verify portion of the erase-verify loop. For example, step 1405 could occur for every erase-verify loop after the first erase-verify loop. In this approach, it is acceptable to omit the erase-verify test for the data memory cells in the first erase-verify loop based on an assumption that the erase operation will not be completed in one erase-verify loop. Instead, the erasing is relatively gradual such that multiple erase loops will be used to complete the erase operation. The verify portion of the first erase-verify loop can therefore be used to verify the dummy memory cells or SG transistors, without a time penalty.

Step 1406 determines whether the data memory cells pass their verify test.

If the decision step 1406 is false, and the maximum allowable number (#) of erase-verify loops has not yet been reached such that decision step 1407 is false, Verase is incremented at step 1404a and a next erase-verify loop begins at step 1402. If decision step 1407 is true, step 1408 sets the status of the erase operation to fail and assigns the block to a bad block pool.

If the decision step 1406 is true, a decision step 1409 determines whether the dummy memory cells and/or SG transistors pass their verify test, e.g., from step 1404. If the decision step 1409 is false, step 1414 sets a fail status for the verify operation and assigns the block to a potential bad block pool. If the decision step 1409 is true, a decision step 1410 determines whether a supplementary verify operation is to be performed. If the decision step 1410 is false, step 1411 sets the status of the erase operation and the status of the verify operation for the dummy memory cells and/or SG transistors to pass and maintains the block in the good block pool.

If the decision step 1410 is true, step 1412 performs supplementary verify operations for the dummy memory cells and/or SG transistors. For example, if an upper boundary verify operation was performed for the SGD transistors during the first erase-verify loop of the erase operation, a lower boundary verify operation can be performed for the SGD transistors during the supplementary verify operations. Upper and lower boundary verify operations can also be performed for the dummy memory cells during the supplementary verify operations in this case.

A decision step 1413 determines whether the dummy memory cells and/or SG transistors pass their verify test in the supplementary verify operations. If the decision step 1413 is false, step 1414 sets a fail status for the verify operation and assigns the block to a potential bad block pool. If the decision step 1413 is true, step 1411 is reached.

FIG. 15-21 depict example voltage signals in erase and verify operations as discussed herein. For simplicity, each erase operation has three erase-verify loops, EV1-EV3. An erase operation typically has multiple erase-verify loops. Each loop has an erase portion in which an erase pulse is applied to charge up the NAND string channels. For some loops, the erase portion is followed by a verify portion which can include an erase-verify test for the data memory cells and/or a verify test for the dummy memory cells or SG transistors. The SG transistor is an SGD transistor in these examples. Also, Vdummy1 and Vdummy2 are for WLDD1 and WLDD2, respectively. Further, Ven is an erase-enable voltage, e.g., 0-0.5 V, Vinh is an erase-inhibit voltage, e.g., 10 V, Vread is a read pass voltage, e.g., 8-10 V, and Vsen is a sensing voltage of the bit line, e.g., 0.8 V. Verase is an erase voltage. Vch is a corresponding channel voltage which is typically slightly less than Verase but the two voltages are depicted as being the same for simplicity. The erase voltage can involve a transition from 0 V to a peak voltage, e.g., 15-25 V, which is stepped up in successive erase-verify iterations after the first erase-verify iteration. The erase voltage include three erase pulses 1501-1503. The first, second and third erase pulses are at t0-t1, t3-t4 and t6-t7, respectively.

The vertical direction indicates voltage and the horizontal direction indicates time.

Figure 15:
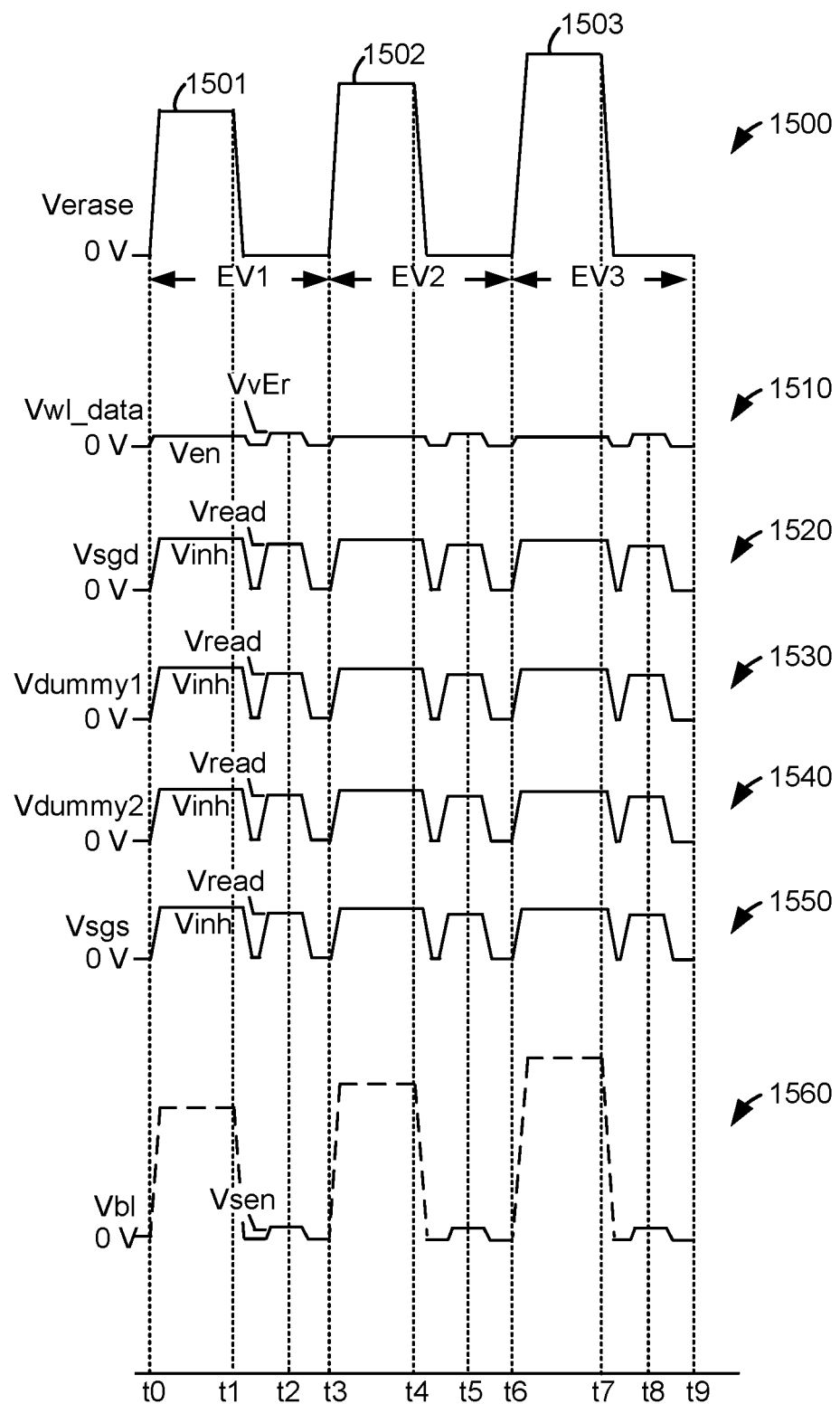
FIG. 15 depicts example voltage signals of an erase operation, consistent with FIG. 12, steps 1200-1206.

FIG. 15 depicts example voltage signals of an erase operation, consistent with FIG. 12, steps 1200-1206. This is a comparison erase operation which does not include detecting out-of-range dummy memory cells and/or SG transistors. The voltage signals extend over time points t0-t9. A voltage signal 1500 depicts Verase and Vch.

A voltage signal 1510 depicts a voltage applied to the data word lines, Vwl_data. This voltage signal increases from 0 V to Ven during each erase pulse. Between the erase pulses, in the verify portion of the erase-verify loops, Vwl_data is set to an erase-verify voltage, VvEr, at which time a sensing operation occurs. The sensing occurs at t2, t5 and t8.

A voltage signal 1520 depicts a voltage applied to the SGD transistors, Vsgd. This voltage signal increases from 0 V to Vinh during each erase pulse. In the verify portion of the erase-verify loops, Vsgd is set to Vread.

A voltage signal 1530 depicts a voltage applied to a first dummy word line, Vdummy1. This voltage signal increases from 0 V to Vinh during each erase pulse. In the verify portion of the erase-verify loops, Vdummy1 is set to Vread.

A voltage signal 1540 depicts a voltage applied to a second dummy word line, Vdummy2. This voltage signal increases from 0 V to Vinh during each erase pulse. In the verify portion of the erase-verify loops, Vdummy2 is set to Vread.

A voltage signal 1550 depicts a voltage applied to the SGS transistors, Vsgs. This voltage signal increases from 0 V to Vinh during each erase pulse. In the verify portion of the erase-verify loops, Vsgs is set to Vread.

A voltage signal 1560 depicts a voltage of the bit lines. The bit line voltage Vbl increases as the channel voltage increases. The dashed lines denote a floating voltage. In the verify portion of the erase-verify loops, Vbl is set to Vsen.

Figure 16:
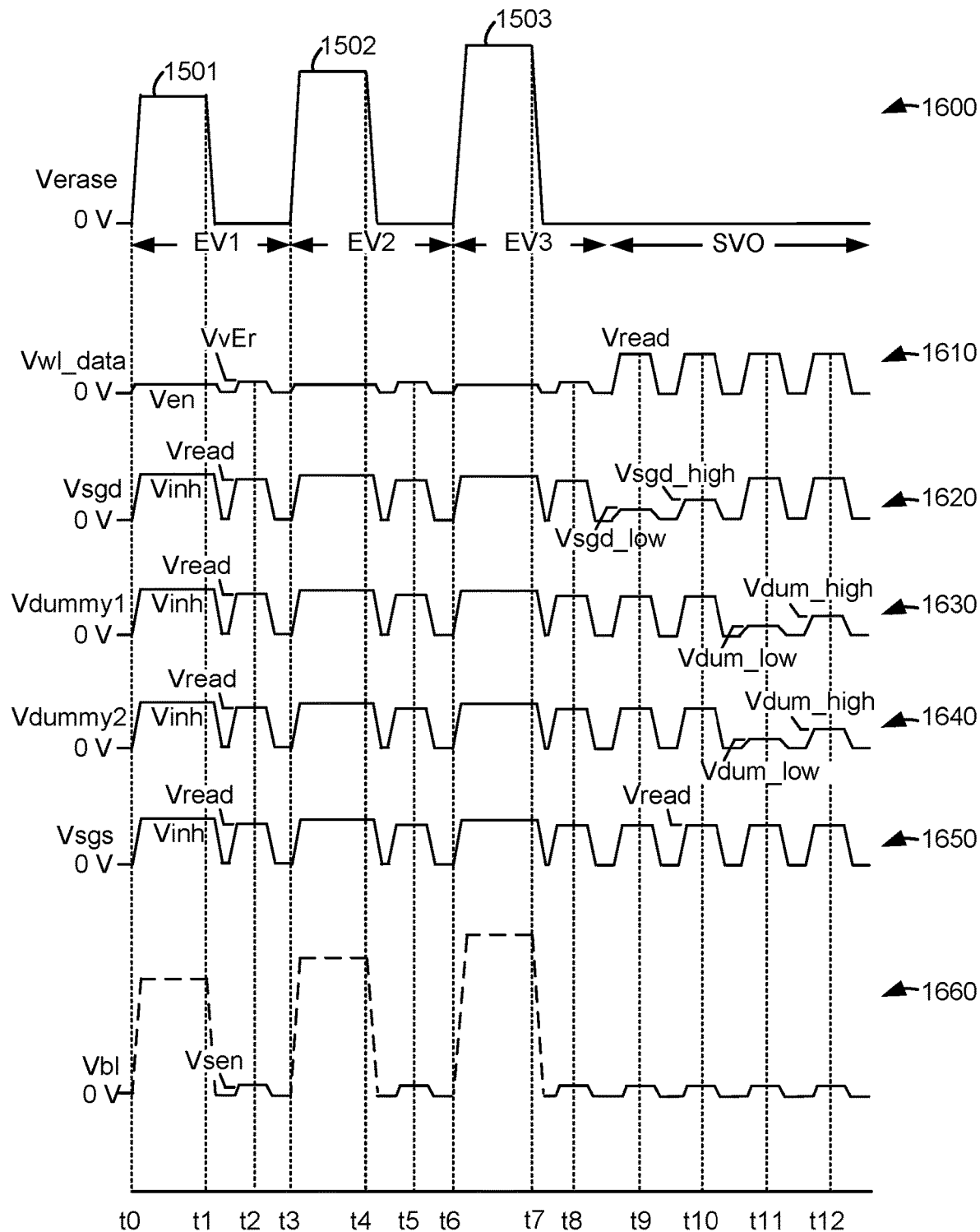
FIG. 16 depicts example voltage signals of an erase operation, consistent with FIG. 12, where the supplementary verify operation detects out-of-range SGD transistors using verify voltages of Vsgd_low and Vsgd_high, and out-of-range dummy memory cells using verify voltages of Vdum_low and Vdum_high, where these verify voltages are common to different dummy word lines.

FIG. 16 depicts example voltage signals of an erase operation, consistent with FIG. 12, where the supplementary verify operation (SVO) detects out-of-range SGD transistors using verify voltages of Vsgd_low and Vsgd_high, and out-of-range dummy memory cells using verify voltages of Vdum_low and Vdum_high, where these verify voltages are common to different dummy word lines.

The voltage signals extend over time points t0-t12. The erase operation extends from t0-t8 and a supplementary verify operation begins when the erase operation ends. A voltage signal 1600 depicts Verase and Vch.

A voltage signal 1610 depicts Vwl_data. This voltage signal increases from 0 V to Ven during each erase pulse. Between the erase pulses, in the verify portion of the erase-verify loops, Vwl_data is set to VvEr, at which time a sensing operation occurs. The sensing occurs at t2, t5 and t8. In the supplementary verify operation, the voltage signal is set to Vread at t9-t12. This allows sensing to occur for the SGD transistors relative to Vsgd_low and Vsgd_high at t9 and t10, respectively, and for the dummy memory cells relative to Vdum_low and Vdum_high at t11 and t12, respectively.

A voltage signal 1620 depicts Vsgd. This voltage signal increases from 0 V to Vinh during each erase pulse. In the verify portion of the erase-verify loops, Vsgd is set to Vread. In the supplementary verify operation, Vsgd is set to Vsgd_low and Vsgd_high at t9 and t10, respectively, when sensing of the SGD transistors occurs. Vsgd is set to Vread at t11 and t12 when sensing occurs for the dummy memory cells.

A voltage signal 1630 depicts a voltage applied to Vdummy1. This voltage signal increases from 0 V to Vinh during each erase pulse. In the verify portion of the erase-verify loops, Vdummy1 is set to Vread. In the PEV operation, Vdummy1 is set to Vread at t9 and t10 when sensing occurs for the SGD transistors, and to Vdum_low and Vdum_high at t11 and t12, respectively, when sensing of the dummy memory cells occurs.

A voltage signal 1640 depicts a voltage applied to a second dummy word line, Vdummy2. This voltage signal increases from 0 V to Vinh during each erase pulse. In the verify portion of the erase-verify loops, Vdummy2 is set to Vread. In the supplementary verify operation, Vdummy2 is set to Vread at t9 and t10 when sensing occurs for the SGD transistors, and to Vdum_low and Vdum_high at t11 and t12, respectively, when sensing of the dummy memory cells occurs. In this example, the dummy memory cells connected to WLDD1 and WLDD2 are sensed concurrently.

A voltage signal 1650 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9-t12. This allows sensing to occur for the SGD transistors at t9 and t10, and for the dummy memory cells at t11 and t12.

A voltage signal 1660 depicts a voltage of the bit lines. The bit line voltage Vbl increases as the channel voltage increases. In the verify portion of the erase-verify loops, Vbl is set to Vsen. In the PER operation, Vbl is set to Vsen at t9-t12. This allows sensing to occur for the SGD transistors at t9 and t10, and for the dummy memory cells at t11 and t12, respectively.

Figure 17:
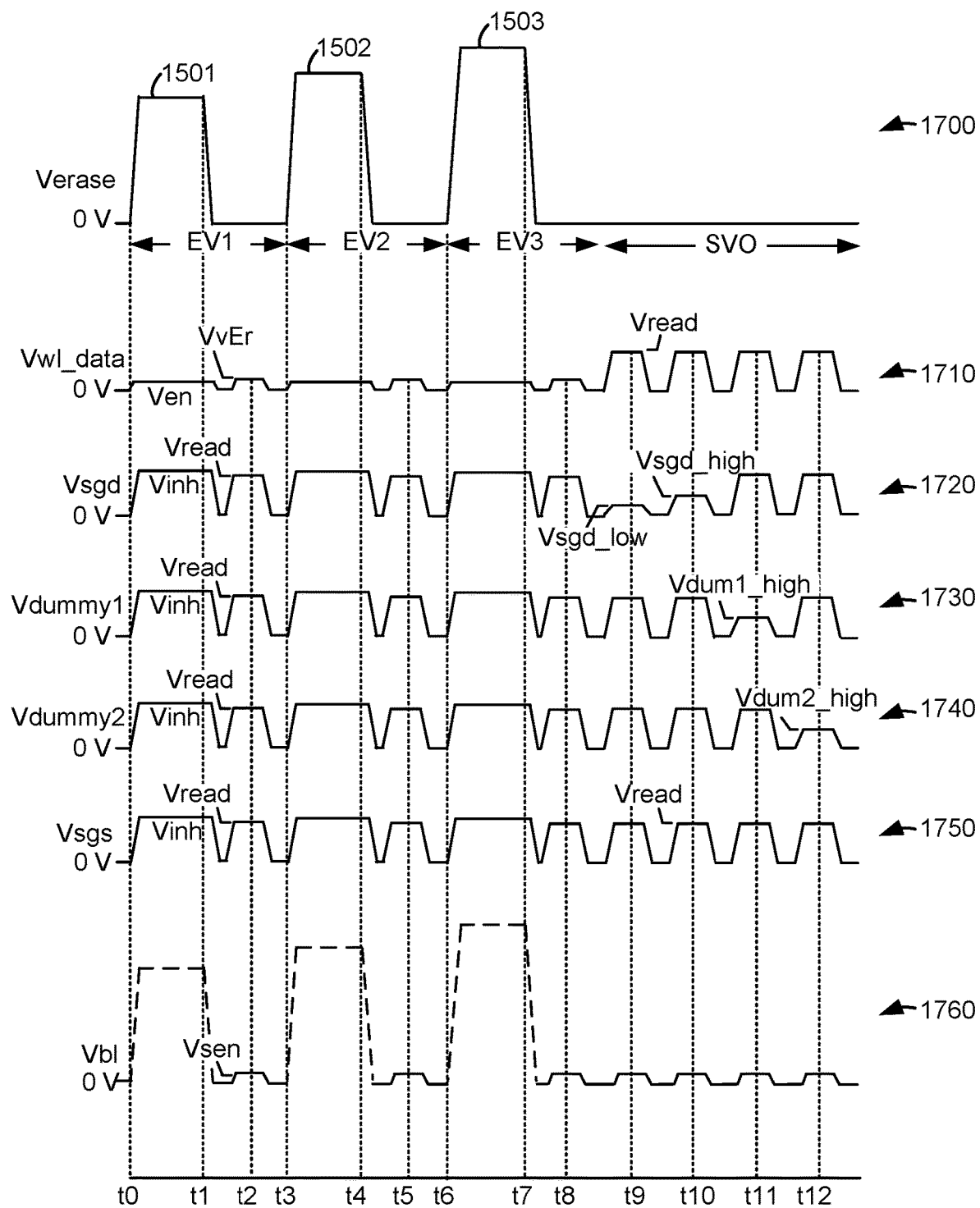
FIG. 17 depicts example voltage signals of an erase operation, consistent with FIG. 12, where the supplementary verify operation detects out-of-range SGD transistors using verify voltages of Vsgd_low and Vsgd_high, and out-of-range dummy memory cells using verify voltages of Vdum1_high and Vdum2_high, where these verify voltages are different for different dummy word lines.

FIG. 17 depicts example voltage signals of an erase operation, consistent with FIG. 12, where the supplementary verify operation (SVO) detects out-of-range SGD transistors using verify voltages of Vsgd_low and Vsgd_high, and out-of-range dummy memory cells using verify voltages of Vdum1_high and Vdum2_high, where these verify voltages are different for different dummy word lines.

The voltage signals extend over time points t0-t12. The erase operation extends from t0-t8 and a supplementary verify operation begins when the erase operation ends. A voltage signal 1700 depicts Verase and Vch.

A voltage signal 1710 depicts Vwl_data. This voltage signal increases from 0 V to Ven during each erase pulse. Between the erase pulses, in the verify portion of the erase-verify loops, Vwl_data is set to VvEr, at which time a sensing operation occurs. The sensing occurs at t2, t5 and t8. In the supplementary verify operation, the voltage signal is set to Vread at t9-t12. This allows sensing to occur for the SGD transistors relative to Vsgd_low and Vsgd_high at t9 and t10, respectively, for WLDD1 dummy memory cells relative to Vdum1_high at t11, and for WLDD2 dummy memory cells relative to Vdum2_high at t12, where Vdum1_high differs from Vdum2_high. This approach allows a separate verify voltage to be used for each dummy word line. A verify operation relative to the lower boundary could optionally also be performed for the dummy memory cells. Generally, detecting a dummy memory cell with a Vth above the upper boundary threshold is more important than detecting a dummy memory cell with a Vth below the lower boundary threshold. A dummy memory cell with a too-high Vth can reduce the current in a NAND string more than a dummy memory cell with a too-low Vth can increase the current in a NAND string. For an SGD transistor, detecting a too-high Vth and a too-low Vth can be equally important.

A voltage signal 1720 depicts Vsgd. This voltage signal increases from 0 V to Vinh during each erase pulse. In the verify portion of the erase-verify loops, Vsgd is set to Vread. In the supplementary verify operation, Vsgd is set to Vsgd_low and Vsgd_high at t9 and t10, respectively, when sensing of the SGD transistors occurs. Vsgd is set to Vread at t11 and t12 when sensing occurs for the dummy memory cells.

A voltage signal 1730 depicts a voltage applied to Vdummy1. This voltage signal increases from 0 V to Vinh during each erase pulse. In the verify portion of the erase-verify loops, Vdummy1 is set to Vread. In the supplementary verify operation, Vdummy1 is set to Vread at t9 and t10 when sensing occurs for the SGD transistors, to Vdum1_high at t11 when sensing of the WLDD1 dummy memory cells occurs, and to Vread at t12 when sensing of the WLDD2 dummy memory cells occurs.

A voltage signal 1740 depicts a voltage applied to a second dummy word line, Vdummy2. This voltage signal increases from 0 V to Vinh during each erase pulse. In the verify portion of the erase-verify loops, Vdummy2 is set to Vread. In the supplementary verify operation, Vdummy2 is set to Vread at t9 and t10 when sensing occurs for the SGD transistors, to Vread at t11 when sensing of the WLDD1 dummy memory cells occurs, and to Vdum2_high at t12 when sensing of the WLDD2 dummy memory cells occurs. In this example, the dummy memory cells connected to WLDD1 and WLDD2 are sensed separately when the WLDD1 and WLDD2 dummy memory cells have separate Vth ranges.

A voltage signal 1750 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9-t12. This allows sensing to occur for the SGD transistors at t9 and t10, for the WLDD1 dummy memory cells at t11, and for the WLDD2 dummy memory cells at t12.

A voltage signal 1760 depicts a voltage of the bit lines. The bit line voltage Vbl increases as the channel voltage increases. In the verify portion of the erase-verify loops, Vbl is set to Vsen. In the supplementary verify operation, Vbl is set to Vsen at t9-t12.

Figure 18:
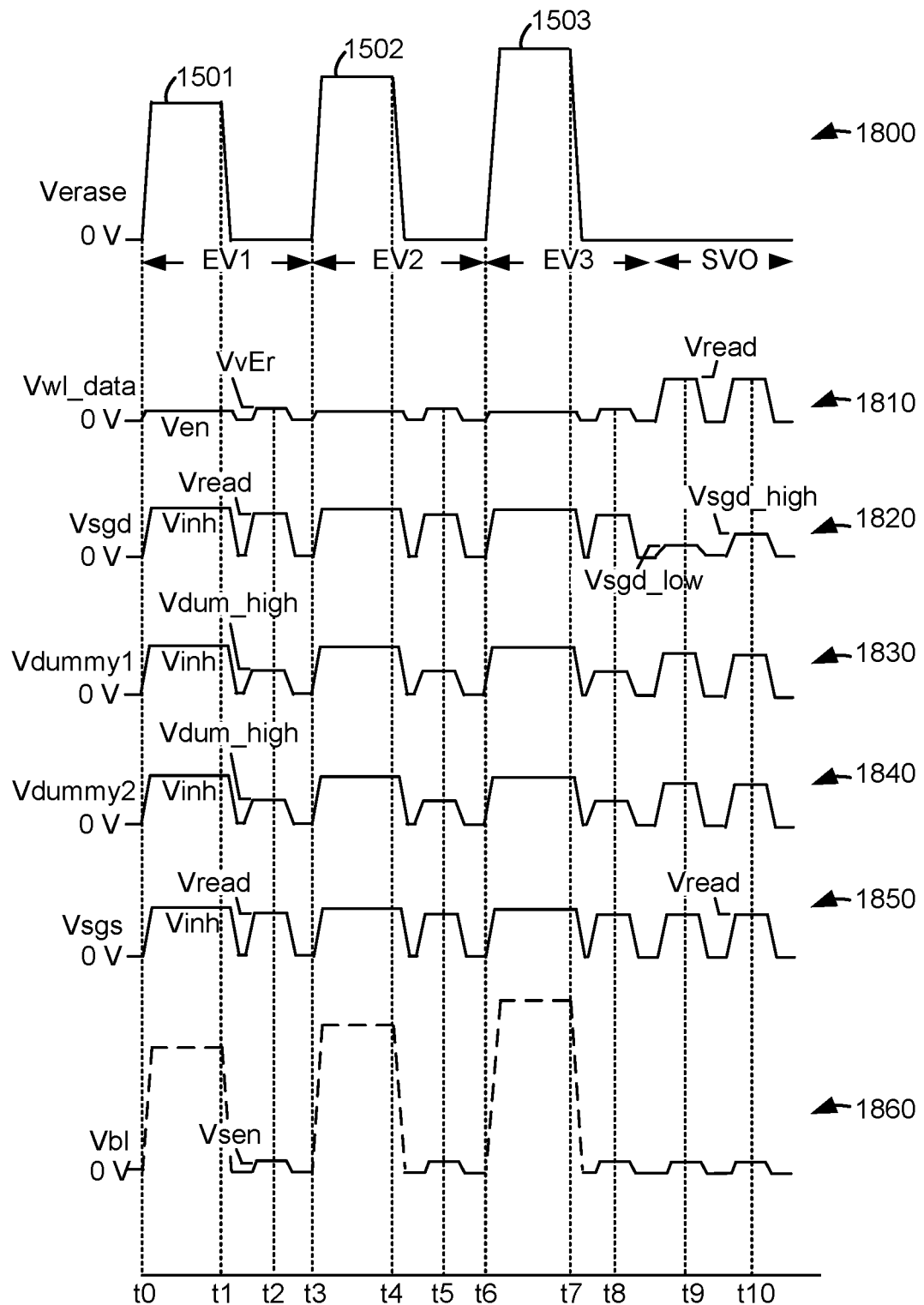
FIG. 18 depicts example voltage signals of an erase operation, consistent with FIG. 13, where the erase operation detects out-of-range dummy memory cells using a verify voltage of Vdum_high, and the supplementary verify operation detects out-of-range SGD transistors using verify voltages of Vsgd_low and Vsgd_high.

FIG. 18 depicts example voltage signals of an erase operation, consistent with FIG. 13, where the erase operation detects out-of-range dummy memory cells using a verify voltage of Vdum_high, and the supplementary verify operation (SVO) detects out-of-range SGD transistors using verify voltages of Vsgd_low and Vsgd_high.

The voltage signals extend over time points t0-t10. The erase operation extends from t0-t8 and a supplementary verify operation begins when the erase operation ends. A voltage signal 1800 depicts Verase and Vch.

A voltage signal 1810 depicts Vwl_data. This voltage signal increases from 0 V to Ven during each erase pulse. Between the erase pulses, in the verify portion of the erase-verify loops, Vwl_data is set to VvEr, at which time a sensing operation occurs. The sensing occurs at t2, t5 and t8. In the supplementary verify operation, the voltage signal is set to Vread at t9 and t10. This allows sensing to occur for the SGD transistors relative to Vsgd_low and Vsgd_high at t9 and t10, respectively.

At t2, t5 and t8, in the verify portion of EV1-EV3, respectively, Vdummy1 and Vdummy2 are set to Vdum_high to allow verifying of the dummy memory cells concurrent with the erase-verify test of the data memory cells. As discussed, based on the assumption that the data memory cells will be erased at some point in the erase operation and have a Vth<VvEr, the sensing can verify the dummy memory cells relative to Vdum_high. The verifying of the SGD transistors occurs in the supplementary verify operation. Reading of the dummy memory cells relative to Vdum_low could optionally occur in the supplementary verify operation but is not shown here.

A voltage signal 1820 depicts Vsgd. This voltage signal increases from 0 V to Vinh during each erase pulse. In the verify portion of the erase-verify loops, Vsgd is set to Vread. In the supplementary verify operation, Vsgd is set to Vsgd_low and Vsgd_high at t9 and t10, respectively, when sensing of the SGD transistors occurs.

A voltage signal 1830 depicts a voltage applied to Vdummy1. This voltage signal increases from 0 V to Vinh during each erase pulse. In the verify portion of the erase-verify loops, Vdummy1 is set to Vdum_high, as discussed. In the supplementary verify operation, Vdummy1 is set to Vread at t9 and t10 when sensing occurs for the SGD transistors.

A voltage signal 1840 depicts a voltage applied to a second dummy word line, Vdummy2. This voltage signal increases from 0 V to Vinh during each erase pulse. In the verify portion of the erase-verify loops, Vdummy2 is set to Vdum_high. In the supplementary verify operation, Vdummy2 is set to Vread at t9 and t10 when sensing occurs for the SGD transistors.

A voltage signal 1850 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9 and t10. This allows sensing to occur for the SGD transistors.

A voltage signal 1860 depicts a voltage of the bit lines. The bit line voltage Vbl increases as the channel voltage increases. In the verify portion of the erase-verify loops, Vbl is set to Vsen. In the supplementary verify operation, Vbl is set to Vsen at t9 and t10.

Figure 19:
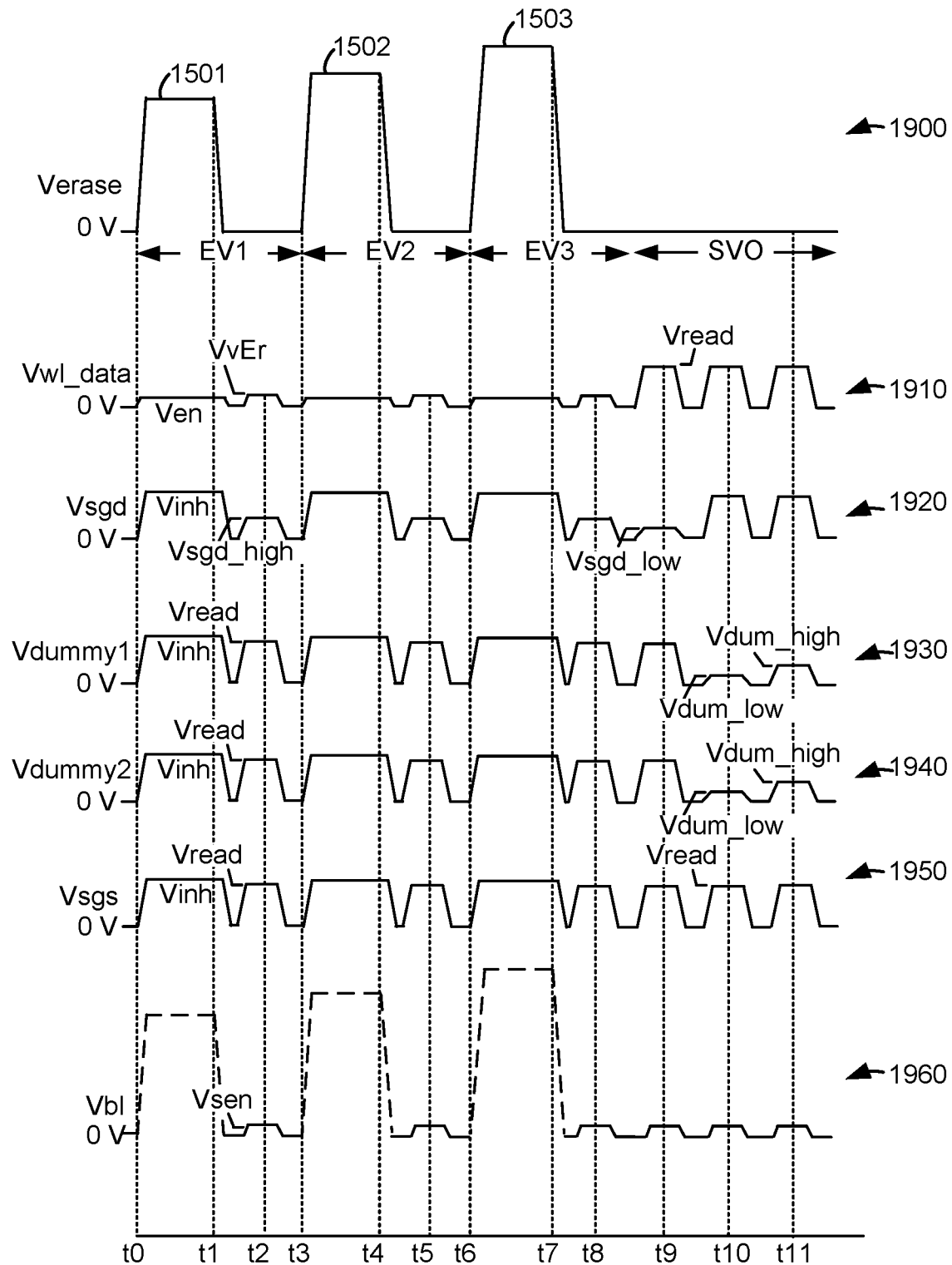
FIG. 19 depicts example voltage signals of an erase operation, consistent with FIG. 13, where the erase operation detects out-of-range SGD transistors using a verify voltage of Vsgd_high, and the supplementary verify operation detects out-of-range SGD transistors using a verify voltage of Vsgd_low and out-of-range dummy memory cells using verify voltages of Vdum_low and Vdum_high.

FIG. 19 depicts example voltage signals of an erase operation, consistent with FIG. 13, where the erase operation detects out-of-range SGD transistors using a verify voltage of Vsgd_high, and the supplementary verify operation (SVO) detects out-of-range SGD transistors using a verify voltage of Vsgd_low and out-of-range dummy memory cells using verify voltages of Vdum_low and Vdum_high. As an option to FIG. 18, the SGD transistors are verified instead of the dummy memory cells in the verify portion of the erase-verify loops.

The voltage signals extend over time points t0-t11. The erase operation extends from t0-t8 and a supplementary verify operation begins when the erase operation ends. A voltage signal 1900 depicts Verase and Vch.

A voltage signal 1910 depicts Vwl_data. This voltage signal increases from 0 V to Ven during each erase pulse. Between the erase pulses, in the verify portion of the erase-verify loops, Vwl_data is set to VvEr, at which time a sensing operation occurs. The sensing occurs at t2, t5 and t8. In the supplementary verify operation, the voltage signal is set to Vread at t9 and t10. This allows sensing to occur for the SGD transistors relative to Vsgd_low and Vsgd_high at t9 and t10, respectively.

At t2, t5 and t8, in the verify portion of EV1-EV3, respectively, Vsgd is set to Vsgd_high to allow verifying of the SGD transistors concurrent with the erase-verify test of the data memory cells. As discussed, based on the assumption that the data memory cells will be erased at some point in the erase operation and have a Vth<VvEr, the sensing can verify the SGD transistors relative to Vsgd_high. The verifying of the SGD transistors relative to Vsgd_low can occur in the supplementary verify operation. Verifying of the dummy memory cells relative to Vdum_low and Vdum_high also occurs in the supplementary verify operation.

A voltage signal 1920 depicts Vsgd. This voltage signal increases from 0 V to Vinh during each erase pulse. In the verify portion of the erase-verify loops, Vsgd is set to Vsgd_high. In the supplementary verify operation, Vsgd is set to Vsgd_low at t9 when sensing of the SGD transistors occurs. Vsgd is set to Vread at t10 and t11 when sensing of the dummy memory cells relative to Vdum_low and Vdum_high, respectively, occurs.

A voltage signal 1930 depicts a voltage applied to Vdummy1. This voltage signal increases from 0 V to Vinh during each erase pulse. In the verify portion of the erase-verify loops, Vdummy1 is set to Vread. In the supplementary verify operation, Vdummy1 is set to Vread at t9 when sensing occurs for the SGD transistors relative to Vsgd_low. Vdummy1 is set to Vdum_low at t10 and Vdum_high at t11 when sensing occurs for the dummy memory cells.

A voltage signal 1940 depicts a voltage applied to a second dummy word line, Vdummy2. This voltage signal increases from 0 V to Vinh during each erase pulse. In the verify portion of the erase-verify loops, Vdummy2 is set to Vread. In the supplementary verify operation, Vdummy2 is set to Vread at t9. Vdummy1 is set to Vdum_low at t10 and Vdum_high at t11 when sensing occurs for the dummy memory cells.

A voltage signal 1950 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9-t11.

A voltage signal 1960 depicts a voltage of the bit lines. The bit line voltage Vbl increases as the channel voltage increases. In the verify portion of the erase-verify loops, Vbl is set to Vsen. In the supplementary verify operation, Vbl is set to Vsen at t9-t11.

Figure 20:
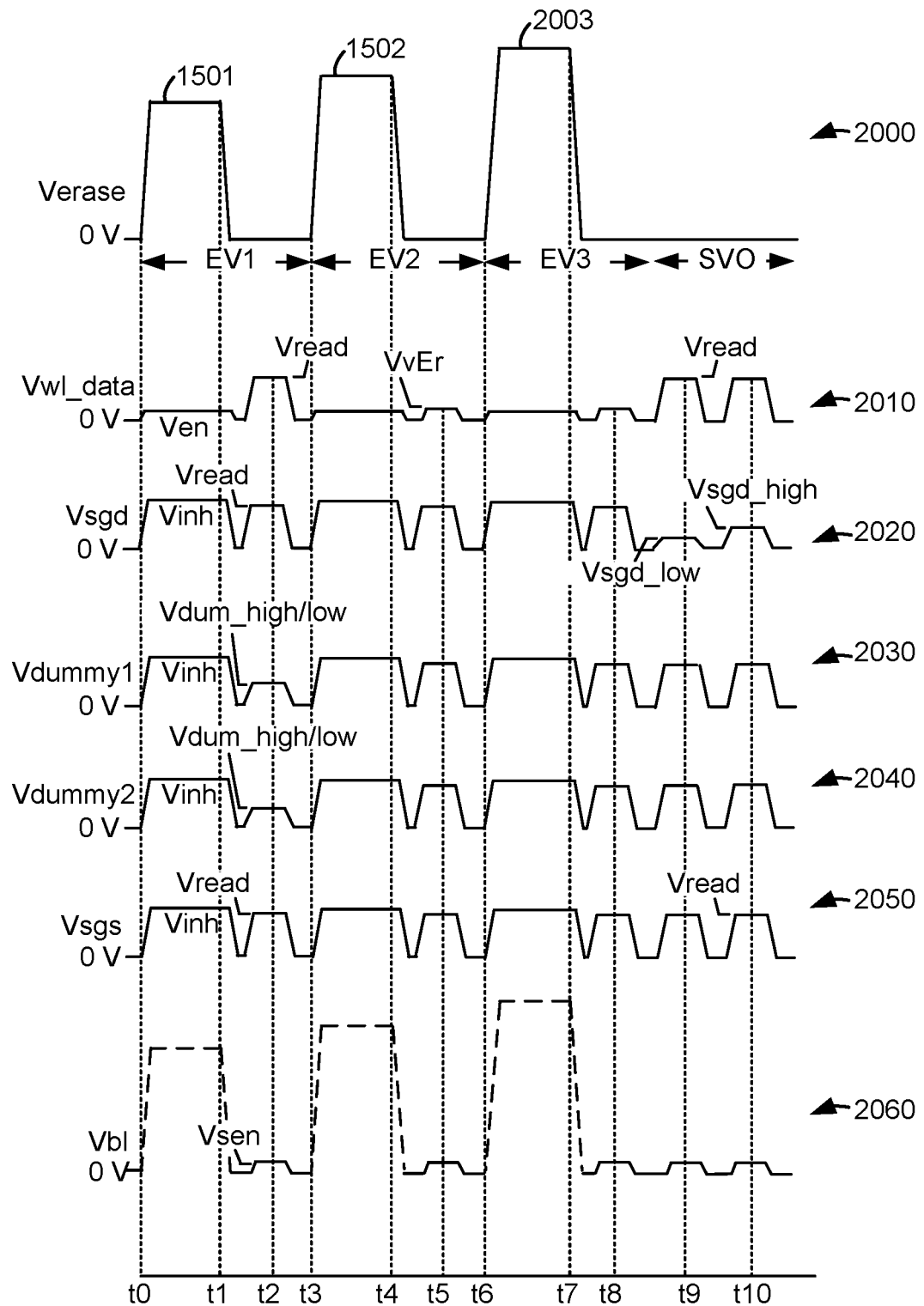
FIG. 20 depicts example voltage signals of an erase operation, consistent with FIG. 14, where the first loop of the erase operation detects out-of-range dummy memory cells using a verify voltage of Vdum_high/low, and the supplementary verify operation detects out-of-range SGD transistors using verify voltages of Vsgd_low and Vsgd_high.
Figure 21:
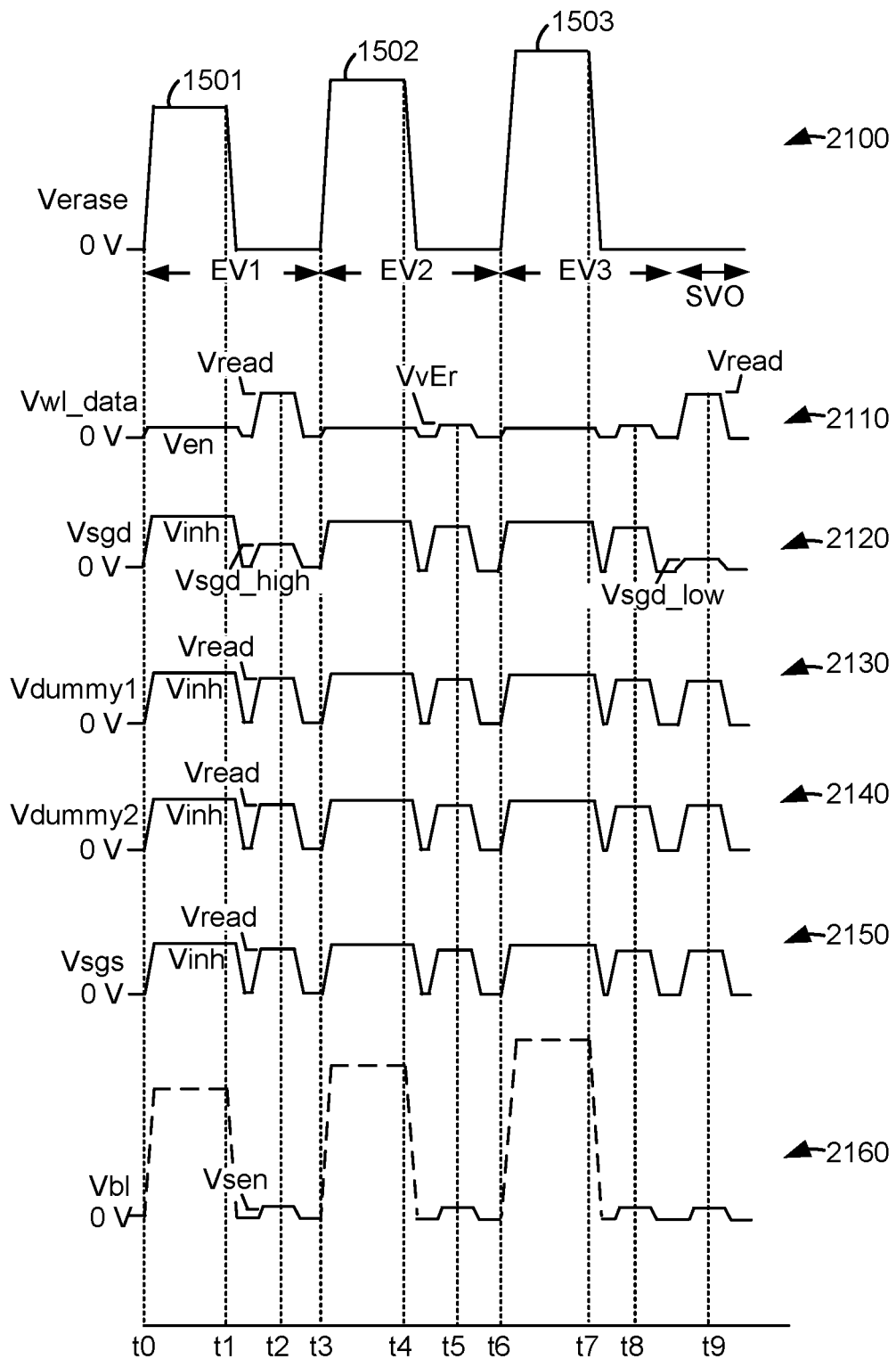
FIG. 21 depicts example voltage signals of an erase operation, consistent with FIG. 14, where the first loop of the erase operation detects out-of-range SGD transistors using Vsgd_high, and the supplementary verify operation detects out-of-range SGD transistors using Vsgd_low.

FIG. 20 depicts example voltage signals of an erase operation, consistent with FIG. 14, where the first loop of the erase operation detects out-of-range dummy memory cells using a verify voltage of Vdum_high/low (Vdum_high or Vdum_high low), and the supplementary verify operation (SVO) detects out-of-range SGD transistors using verify voltages of Vsgd_low and Vsgd_high. As discussed, assuming the erase operation will not be completed in one erase-verify loop, the erase-verify test for the data memory cells can be omitted in the first erase-verify loop. A verify operation for the dummy memory cells is performed instead. In the example of FIG. 21, a verify operation for the SGD transistors is performed instead.

The voltage signals extend over time points t0410. The erase operation extends from t0-t8 and a supplementary verify operation begins when the erase operation ends. A voltage signal 2000 depicts Verase and Vch.

A voltage signal 2010 depicts Vwl_data. This voltage signal increases from 0 V to Ven during each erase pulse. In the verify portion of the first erase-verify loop, EV1, Vwl_data is set to Vread to allow verifying of the dummy memory cells relative to Vdum_high/low at t2. In at least one erase-verify loop of the erase operation which follows the first erase-verify loop, but not in the first erase-verify loop, Vwl_data is set to VvEr to sense the data memory cells relative to VvEr. This sensing relative to VvEr occurs at t5 and t8. In the option shown, the sensing relative to VvEr occurs in each remaining erase-verify loop of the erase operation which follows the first erase-verify loop. In the supplementary verify operation, the voltage signal is set to Vread at t9 and t10. This allows sensing to occur for the SGD transistors relative to Vsgd_low and Vsgd_high at t9 and t10, respectively.

A voltage signal 2020 depicts Vsgd. This voltage signal increases from 0 V to Vinh during each erase pulse. At t2, in the verify portion of EV1, Vsgd is set to Vread to allow verifying of the dummy memory cells. At t5 and t8, in the verify portion of EV2 and EV3, respectively, Vsgd is set to Vread to allow sensing of the data memory cells. In the supplementary verify operation, Vsgd is set to Vsgd_low and Vsgd_high at t9 and t10 to allow sensing of the SGD transistors relative to these boundary voltages of an allowable Vth range.

A voltage signal 2030 depicts a voltage applied to Vdummy1. This voltage signal increases from 0 V to Vinh during each erase pulse. In the verify portion of the first erase-verify loop, at t2, Vdummy1 is set to Vdum_high/low to allow verifying of the respective WLDD1 dummy memory cells, for example. In the verify portions of the remaining erase-verify loops, at t5 and t8, Vdummy1 is set to Vread to allow sensing of the data memory cells. In the supplementary verify operation, Vdummy1 is set to Vread at t9 and t10 to allow verifying of the SGD transistors.

A voltage signal 2040 depicts a voltage applied to a second dummy word line, Vdummy2. This voltage signal increases from 0 V to Vinh during each erase pulse. In the verify portion of the first erase-verify loop, at t2, Vdummy2 is set to Vdum_high/low to allow verifying of the respective WLDD2 dummy memory cells, for example. This is concurrent with the verifying of the WLDD1 dummy memory cells, in this example. In the verify portions of the remaining erase-verify loops, at t5 and t8, Vdummy2 is set to Vread to allow sensing of the data memory cells. In the supplementary verify operation, Vdummy2 is set to Vread at t9 and t10 to allow verifying of the SGD transistors.

A voltage signal 2050 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9 and t10.

A voltage signal 2060 depicts a voltage of the bit lines. The bit line voltage Vbl increases as the channel voltage increases. In the verify portion of the erase-verify loops, Vbl is set to Vsen. In the supplementary verify operation, Vbl is set to Vsen at t9 and t10.

FIG. 21 depicts example voltage signals of an erase operation, consistent with FIG. 14, where the first loop of the erase operation detects out-of-range SGD transistors using Vsgd_high, and the supplementary verify operation (SVO) detects out-of-range SGD transistors using Vsgd_low.

The voltage signals extend over time points t0-t9. The erase operation extends from t0-t8 and a supplementary verify operation begins when the erase operation ends. A voltage signal 2100 depicts Verase and Vch.

A voltage signal 2110 depicts Vwl_data. This voltage signal increases from 0 V to Ven during each erase pulse. In the verify portion of the first erase-verify loop, EV1, Vwl_data is set to Vread to allow verifying of the SGD transistors relative to Vsgd_high, for example. In at least one erase-verify loop of the erase operation which follows the first erase-verify loop, but not in the first erase-verify loop, Vwl_data is set to VvEr to sense the data memory cells relative to VvEr. This sensing relative to VvEr occurs at t5 and t8. In the option shown, the sensing relative to VvEr occurs in each remaining erase-verify loop of the erase operation which follows the first erase-verify loop. In the supplementary verify operation, the voltage signal is set to Vread at t9. This allows sensing to occur for the SGD transistors relative to Vsgd_low at t9. In an option, the SGD transistors are sensed relative to Vsgd_low during EV1 and relative to Vsgd_high in the supplementary verify operation.

A voltage signal 2120 depicts Vsgd. This voltage signal increases from 0 V to Vinh during each erase pulse. At t2, in the verify portion of EV1, Vsgd is set to Vsgd_high to sense the SGD transistors relative to this boundary voltage. At t5 and t8, in the verify portion of EV2 and EV3, respectively, Vsgd is set to Vread to allow sensing of the data memory cells. In the supplementary verify operation, Vsgd is set to Vsgd_low at t9 to allow sensing of the SGD transistors relative to this boundary voltage.

A voltage signal 2130 depicts a voltage applied to Vdummy1. This voltage signal increases from 0 V to Vinh during each erase pulse. In the verify portion of the first erase-verify loop, at t2, Vdummy1 is set to Vread to allow verifying of the SGD transistors. In the verify portions of the remaining erase-verify loops, at t5 and t8, Vdummy1 is set to Vread to allow sensing of the data memory cells. In the supplementary verify operation, Vdummy1 is set to Vread at t9 to allow verifying of the SGD transistors.

A voltage signal 2140 depicts a voltage applied to a second dummy word line, Vdummy2. This voltage signal increases from 0 V to Vinh during each erase pulse. In the verify portion of the first erase-verify loop, at t2, Vdummy2 is set to Vread to allow verifying of the SGD transistors. In the verify portions of the remaining erase-verify loops, at t5 and t8, Vdummy2 is set to Vread to allow sensing of the data memory cells. In the supplementary verify operation, Vdummy2 is set to Vread at t9 to allow verifying of the SGD transistors.

A voltage signal 2150 depicts a voltage applied to the SGS transistors, Vsgs. This voltage signal increases from 0 V to Vinh during each erase pulse. In the verify portion of the erase-verify loops, Vsgs is set to Vread. In the supplementary verify operation, the voltage signal is set to Vread at t9.

A voltage signal 2160 depicts a voltage of the bit lines. The bit line voltage Vbl increases as the channel voltage increases. In the verify portion of the erase-verify loops, Vbl is set to Vsen. In the supplementary verify operation, Vbl is set to Vsen at t9.

In the example shown, the SGD transistors are verified relative to Vsgd_high in the first loop and relative to Vsgd_low in the SVO. In another option, the SGD transistors are verified relative to Vsgd_low in the first loop and relative to Vsgd_high in the SVO FIG. 22 depicts example commands and statuses for use in the process of FIG. 10. A control circuit can issue commands to perform the erase operation and verify operations as described herein. The control circuit can be on the same die as the memory cells or on a separate die. In one approach, there is a dedicated command CMD XX→60 h-Address(3 cycle)-D0h=>Busy→Ready. "60 h" denotes an erase block command in a first command cycle. "Address (3 cycle)" denotes a 3 cycle or byte address of a block to be erased. The address can include information to identify a plane and a block, for example. "D0h" denotes a second command cycle. "Busy" indicates that a ready/busy pin of the chip has a busy status and "Ready" indicates that the ready/busy pin of the chip has a ready status.

In one approach, CMD XX is a prefix command which precedes a normal erase command, e.g., "60 h," to indicate that certain verify operations are to be performed for dummy memory cells and/or SGD transistors during the erase operation and/or in a supplementary verify operation. A prefix command is a command which precedes another related command. The prefix command can have a desired format and comprise one or more bytes, for instance.

A further command, CMD YYh, is a dedicated status return command to read out the statuses of the erase operation and the verify operation. This command is a check status command. The status can be a pass/fail result, as discussed previously.

In another possible approach, the erase and verify operations are initiated by a device parameter on the memory chip. The status return command is used as mentioned above to read out the statuses of the erase operation and the verify operation.

Commands can be issued by the off-chip controller 122 to the on-chip control circuitry 110 including the state machine 112 in connection with an erase operation, for example. The on-chip control circuitry 110 including the state machine 112 can report back to the controller 122 with a status of the erase and verify operations.

In FIG. 22, IO0-IO7 denote input/output bytes. These are bytes which can be transmitted from the control circuitry 110 to the controller 122, for example, to report statuses of the erase and verify operations. IO0 denotes a pass or fail status of an erase operation for data memory cells in a chip. Generally, blocks in multiple planes can be erased concurrently. If any of the blocks fails to successfully complete the erase operation, a status return byte is set to 1 to denote a fail status. If all blocks successfully complete the erase operation, a status return byte is set to 0 to denote a pass status.

IO1 denotes a pass or fail status of an erase operation for data memory cells of a block in a plane 0 (e.g., P0 in FIG. 4). IO2 denotes a pass or fail status of an erase operation for data memory cells of a block in a plane 1 (e.g., P1 in FIG. 4). In both cases, a status return byte is set to 0 or 1 to denote a pass or fail status, respectively.

The statuses of 100-102 are separate from the verify operation status.

IO3 and IO4 denote a pass or fail status of the verify operation for dummy memory cells and/or SG transistors in a block in plane 0 or plane 1, respectively. A status return byte is set, e.g., to 0 or 1 to denote a pass (e.g., dummy memory cells and/or SG transistors are in-range) or fail (e.g., dummy memory cells and/or SG transistors are out-of-range) status, respectively.

IO5 denotes a true busy status as busy or ready based on a value of 0 or 1, respectively. This indicates whether the chip is busy and cannot accept commands, or is ready to accept commands.

IO6 and IO7 have a value of 0 and are not used in this example.

FIG. 23 depicts an example process for re-trimming the threshold voltages of dummy memory cells and/or select gate transistors, consistent with the process of FIG. 10, step 1006. Step 2301 begins a re-trimming process for a potentially bad block. In one approach, step 2302 accesses data which identifies out-of-range dummy memory cells and/or SG transistors. For example, see the table 2400 of FIG. 24, which identifies out-of-range SGD transistors. A similar table can be provided to identify out-of-range dummy memory cells.

When this type of data is available, step 2303 erases the above-range dummy memory cells and/or SG transistors (which have a Vth above an upper boundary of an allowable range) until they are in the allowable range of threshold voltages. Step 2304 programs the below-range dummy memory cells and/or SG transistors (which have a Vth below a lower boundary of an allowable range) until they are in the allowable range of threshold voltages.

The erasing can involve performing one or more erase-verify iterations in which the dummy memory cells and/or SG transistors are biased for erasing while the data memory cells are biased to inhibit erasing. A verify test can be performed in each erase-verify iteration to determine when the Vth is less than the upper boundary, such as Vdum_high or Vsgd_high. The programming can involve performing one or more program-verify iterations in which the dummy memory cells and/or SG transistors are biased for programming while the data memory cells are biased to inhibit programing. A verify test can be performed in each program-verify iteration to determine when the Vth is above the lower boundary, such as Vdum_low or Vsgd_low.

Step 2303 can optionally be used to perform verify operations to identify the out-of-range dummy memory cells and/or SG transistors such as when the stored data does not identify the specific out-of-range SG transistors and/or dummy memory cells. For example, the data may identify a block which has an out-of-range SG transistor and/or memory cell, in which case step 2303 is performed to identify the specific out-of-range SG transistors and/or memory cells and whether they are out or range on the high side or the low side.

In one approach, during a verify operation for select gate transistors, a control circuit is configured to store data identifying a subset of the select gate transistors, the subset having threshold voltages outside the respective allowable range of threshold voltages. When the block is in the potential bad block pool and a number of blocks in the potential bad block pool exceeds a threshold, the control circuit is configured to re-trim threshold voltages of the subset of the select gate transistors based on the stored data without re-trimming threshold voltages of remaining select gate transistors of the set of NAND strings. For example, in FIG. 7A, the subset of the select gate transistors SGD(0)-SGD(3) can include SGD(0) and the remaining select gate transistors can include SGD(1)-SGD(3).

Figure 24:
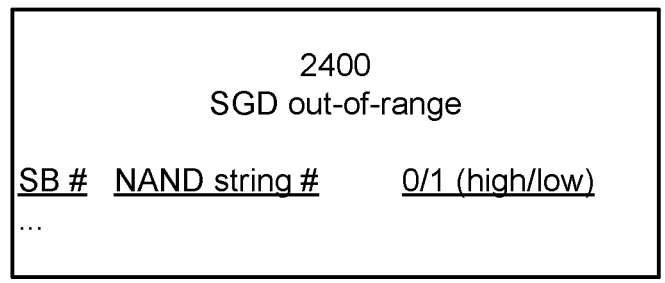
FIG. 24 depicts a table identifying out-of-range SGD transistors.

FIG. 24 depicts a table identifying out-of-range SGD transistors. As mentioned, each NAND string can be identified by a NAND string number and sub-block number, ne one approach. An out-of-range SGD transistors, for example, can therefore be identified by the NAND string in which it is located. The table can be populated based on the results of a verify operation which detects out-of-range dummy memory cells and/or SG transistors as described herein. A first column provides the sub-block (SB) number (#), a second column provides the NAND string #, and a third column indicates whether the associated SGD transistor is too high (by a 0 bit) or too low (by a 1 bit).

Accordingly, it can be see that in one implementation, an apparatus comprises: a control circuit configured to connect to a set of NAND strings in a block, each NAND string in the set of NAND strings comprising a select gate transistor and data memory cells, and the circuit is configured to: perform an erase operation for the data memory cells; perform a verify operation for the select gate transistors relative to at least one boundary voltage of a respective allowable range of threshold voltages; check a status of the erase operation and a status of the verify operation; and assign the block to a potential bad block pool if the status of the erase operation is a pass status and the status of the verify operation is a fail status, the status of the erase operation is the pass status when the erase operation is successfully completed and the status of the verify operation is the fail status when more than a specified number of the select gate transistors have a threshold voltage outside the respective allowable range of threshold voltages.

In another implementation, a method comprises: issuing one or more commands for a block, the block comprising a set of NAND strings, each NAND string in the set of NAND strings comprising a select gate transistor and data memory cells, the one or more commands are for an erase operation of the data memory cells and a verify operation for the select gate transistors relative to at least one boundary voltage of a respective allowable range of threshold voltages; issuing a check status command to obtain a status of the erase operation and a check status command to obtain a status of the verify operation; and deciding whether to assign the block to a potential bad block pool based on the status of the erase operation and the status of the verify operation.

In another implementation, an apparatus comprises: a control circuit configured to connect to a set of NAND strings in a block, each NAND string in the set of NAND strings comprising a select gate transistor and data memory cells; and an interface connected to the control circuit. The circuit is configured to issue commands via the interface to: perform an erase operation for the data memory cells, the performing the erase operation comprises performing a plurality of erase-verify loops for the set of NAND strings, each erase-verify loop comprising an erase portion and a verify portion; in the erase portion of each erase-verify loop, bias the data memory cells for erase; in the verify portion of each erase-verify loop, perform a verify operation for the select gate transistors relative to at least one boundary voltage of a respective allowable range of threshold voltages while concurrently performing an erase-verify test for the data memory cells; and identify the block as being faulty if the erase-verify test for the data memory cells is not successful upon completion of the plurality of erase-verify loops.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of NAND strings in a block, each NAND string in the set of NAND strings comprising a select gate transistor and data memory cells, and the circuit is configured to:
perform an erase operation for the data memory cells;
perform a verify operation for the select gate transistors relative to at least one boundary voltage of a respective allowable range of threshold voltages;
check a status of the erase operation and a status of the verify operation; and
assign the block to a potential bad block pool if the status of the erase operation is a pass status and the status of the verify operation is a fail status, the status of the erase operation is the pass status when the erase operation is successfully completed and the status of the verify operation is the fail status when more than a specified number of the select gate transistors have a threshold voltage outside the respective allowable range of threshold voltages.

2. The apparatus of claim 1, wherein:
when the block is in the potential bad block pool and a number of blocks in the potential bad block pool exceeds a threshold, the control circuit is configured to:
re-trim threshold voltages of the select gate transistors; and
after the re-trimming:
perform another erase operation for the data memory cells;
perform another verify operation for the select gate transistors relative to at least one boundary voltage of the respective allowable range of threshold voltages;
check a status of the another erase operation and a status of the another verify operation; and
assign the block to a bad block pool if the status of the another verify operation is the fail status; and
assign the block to a good block pool if the status of the another erase operation and the status of the another verify operation are both the pass status.

3. The apparatus of claim 1, wherein:
during the verify operation for the select gate transistors, the control circuit is configured to store data identifying a subset of the select gate transistors, the subset having threshold voltages outside the respective allowable range of threshold voltages; and
when the block is in the potential bad block pool and a number of blocks in the potential bad block pool exceeds a threshold, the control circuit is configured to re-trim threshold voltages of the subset of the select gate transistors based on the stored data without re-trimming threshold voltages of remaining select gate transistors of the set of NAND strings.

4. The apparatus of claim 1, wherein:
the control circuit is configured to perform the verify operation for the select gate transistors after the erase operation is completed.

5. The apparatus of claim 1, wherein:
the control circuit is configured to perform the verify operation for the select gate transistors concurrent with performing an erase-verify test for the data memory cells in one or more erase-verify loops of the erase operation.

6. The apparatus of claim 1, wherein the control circuit is configured to:
perform the verify operation for the select gate transistors concurrent with applying a read pass voltage to the data memory cells in a first erase-verify loop of the erase operation; and
perform an erase-verify test for the data memory cells in at least one erase-verify loop of the erase operation which follows the first erase-verify loop but not in the first erase-verify loop.

7. The apparatus of claim 1, wherein:
the control circuit is configured to assign the block to a good block pool if the status of the erase operation and the status of the verify operation for the select gate transistors are both the pass status.

8. The apparatus of claim 1, wherein:
the erase operation for the data memory cells comprises a plurality of erase-verify loops; and
the status of the erase operation is the pass status if the erase operation is completed within a maximum allowable number of erase-verify loops.

9. The apparatus of claim 1, wherein:
each NAND string comprises a first drain-side dummy memory cell; and
the control circuit is configured to:
perform a verify operation for the first drain-side dummy memory cells relative to at least one boundary voltage of a respective allowable range of threshold voltages;
check a status of the verify operation for the first drain-side dummy memory cells; and
assign the block to the potential bad block pool if the status of the verify operation for the first drain-side dummy memory cells is the fail status.

10. The apparatus of claim 9, wherein:
each NAND string comprises a second drain-side dummy memory cell; and
the control circuit is configured to:
perform a verify operation for the second drain-side dummy memory cells relative to at least one boundary voltage of a respective allowable range of threshold voltages, separately from the verify operation for the first drain-side dummy memory cells;
check a status of the verify operation for the second drain-side dummy memory cells; and
assign the block to the potential bad block pool if the status of the verify operation for the second drain-side dummy memory cells is the fail status.

11. The apparatus of claim 9, wherein:
the control circuit is configured to perform the verify operation for the first drain-side dummy memory cells concurrent with performing an erase-verify test for the data memory cells relative to an erase-verify voltage in one or more erase-verify loops of the erase operation.

12. The apparatus of claim 9, wherein the control circuit is configured to:
perform the verify operation for the first drain-side dummy memory cells concurrent with applying a read pass voltage to the data memory cells in a first erase-verify loop of the erase operation; and
perform an erase-verify test for the data memory cells in at least one erase-verify loop of the erase operation which follows the first erase-verify loop but not in the first erase-verify loop.

13. The apparatus of claim 9, wherein:
the control circuit is configured to assign the block to a good block pool if the status of the erase operation, the status of the verify operation for the select gate transistors, and the status of verify operation for the first drain-side dummy memory cells are all the pass status.

14. A method, comprising:
issuing one or more commands for a block, the block comprising a set of NAND strings, each NAND string in the set of NAND strings comprising a select gate transistor and data memory cells, the one or more commands are for an erase operation of the data memory cells and a verify operation for the select gate transistors relative to at least one boundary voltage of a respective allowable range of threshold voltages;
issuing a check status command to obtain a status of the erase operation and a check status command to obtain a status of the verify operation; and
deciding whether to assign the block to a potential bad block pool based on the status of the erase operation and the status of the verify operation.

15. The method of claim 14, wherein:
the one or more commands comprise a prefix command followed by an erase block command for the block, the erase block command is for the erase operation and the prefix command is for the verify operation.

16. The method of claim 14, wherein:
the one or more command comprise a device parameter which enables the erase operation and the verify operation.

17. The method of claim 14, further comprising:
re-trimming threshold voltages of the select gate transistors in response to the block being identified as being in the potential bad block pool; and
after the re-trimming:
issuing one or more commands for another erase operation of the data memory cells and another verify operation for the select gate transistors relative to at least one boundary voltage of the respective allowable range of threshold voltages
issuing a check status command to obtain a status of the another erase operation and a check status command to obtain a status of the another verify operation; and
deciding whether to assign the block to a bad block pool based on the status of the another erase operation and the status of the another verify operation.

18. The method of claim 17, further comprising:
identifying the block as being in the bad block pool when the status of the another erase operation and the status of the another verify operation are not both a pass status; and
identifying the block as being in a good block pool when the status of the another erase operation and the status of the another verify operation are both the pass status.

19. An apparatus, comprising:
a control circuit configured to connect to a set of NAND strings in a block, each NAND string in the set of NAND strings comprising a select gate transistor and data memory cells; and
an interface connected to the control circuit, the circuit is configured to issue commands via the interface to:
perform an erase operation for the data memory cells, the performing the erase operation comprises performing a plurality of erase-verify loops for the set of NAND strings, each erase-verify loop comprising an erase portion and a verify portion;
in the erase portion of each erase-verify loop, bias the data memory cells for erase;
in the verify portion of each erase-verify loop, perform a verify operation for the select gate transistors relative to at least one boundary voltage of a respective allowable range of threshold voltages while concurrently performing an erase-verify test for the data memory cells; and
identify the block as being faulty if the erase-verify test for the data memory cells is not successful upon completion of the plurality of erase-verify loops.

20. The apparatus of claim 19, wherein:
the plurality of erase-verify loops comprise a maximum allowable number of erase-verify loops for the erase operation.

* * * * *